US008138854B2

(12) United States Patent
Hara et al.

(10) Patent No.: US 8,138,854 B2
(45) Date of Patent: Mar. 20, 2012

(54) FILTER, BRANCHING FILTER AND COMMUNICATION APPARATUS

(75) Inventors: Motoaki Hara, Kawasaki (JP); Shogo Inoue, Kawasaki (JP); Jun Tsutsumi, Kawasaki (JP); Takashi Matsuda, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 356 days.

(21) Appl. No.: 12/512,571

(22) Filed: Jul. 30, 2009

(65) Prior Publication Data

US 2010/0026419 A1 Feb. 4, 2010

(30) Foreign Application Priority Data

Jul. 31, 2008 (JP) .................. 2008-198886

(51) Int. Cl.
*H01P 5/12* (2006.01)
*H03H 9/52* (2006.01)
*H03H 9/54* (2006.01)
*H03H 9/64* (2006.01)
*H03H 9/70* (2006.01)
*H03H 9/72* (2006.01)

(52) U.S. Cl. ........ 333/126; 333/129; 333/132; 333/133; 333/189; 333/193

(58) Field of Classification Search .......... 333/126–129, 333/132–135, 25, 26, 189–193, 195
See application file for complete search history.

(56) References Cited

U.S. PATENT DOCUMENTS

| RE37,639 | E | 4/2002 | Ehara et al. |
|---|---|---|---|
| 6,472,959 | B1 * | 10/2002 | Beaudin et al. ............... 333/193 |
| 6,566,981 | B2 | 5/2003 | Urabe et al. |
| 6,917,258 | B2 | 7/2005 | Kushitani et al. |
| 6,940,368 | B2 | 9/2005 | Plessky et al. |
| 6,972,644 | B2 | 12/2005 | Nishizawa et al. |
| 7,164,306 | B2 | 1/2007 | Makino |
| 7,479,850 | B2 * | 1/2009 | Kearns et al. ................. 333/189 |
| 7,554,419 | B2 | 6/2009 | Inoue et al. |
| 2002/0014121 | A1 | 2/2002 | Urabe et al. |
| 2003/0112768 | A1 * | 6/2003 | Frank ............................ 370/281 |

(Continued)

FOREIGN PATENT DOCUMENTS

EP 1 480 337 A1 11/2004

(Continued)

OTHER PUBLICATIONS

The Office Action dated Sep. 23, 2011, in U.S. Appl. No. 12/709,182.

(Continued)

*Primary Examiner* — Barbara Summons
(74) *Attorney, Agent, or Firm* — Chen Yoshimura LLP

(57) ABSTRACT

A filter includes: a converter circuit, provided with a single-type common terminal and two balanced terminals, for performing conversion between a balanced line and an unbalanced line; two filter units coupled to each of the balanced terminals of the converter circuit and allowing passage of a signal in a pass band; and a bridging capacitor arranged to extend across the converter circuit and one of the filter units in a bridging manner, wherein the inductance of an opposite-side line of one of the filter units relative to the converter circuit is electromagnetically coupled to the inductance of a line coupling the other filter unit and the converter circuit.

18 Claims, 27 Drawing Sheets

U.S. PATENT DOCUMENTS

| | | | |
|---|---|---|---|
| 2004/0070469 A1 | 4/2004 | Plessky et al. | |
| 2004/0219888 A1* | 11/2004 | Iwamoto et al. | 455/76 |
| 2004/0233019 A1 | 11/2004 | Inoue et al. | |
| 2005/0046520 A1 | 3/2005 | Nishizawa et al. | |
| 2005/0281210 A1 | 12/2005 | Makino | |
| 2006/0091977 A1 | 5/2006 | Inoue et al. | |
| 2007/0268092 A1 | 11/2007 | Inoue et al. | |
| 2008/0007370 A1* | 1/2008 | Matsumoto | 333/194 |
| 2009/0058557 A1 | 3/2009 | Tsurunari et al. | |
| 2009/0273408 A1* | 11/2009 | Inoue et al. | 333/4 |
| 2010/0109800 A1* | 5/2010 | Ueda et al. | 333/132 |
| 2010/0150075 A1 | 6/2010 | Inoue et al. | |
| 2010/0244979 A1 | 9/2010 | Matsuda et al. | |

FOREIGN PATENT DOCUMENTS

| | | |
|---|---|---|
| EP | 1 482 639 A2 | 12/2004 |
| EP | 1 653 615 A1 | 5/2006 |
| EP | 1 860 773 A2 | 11/2007 |
| EP | 1 883 159 A1 | 1/2008 |
| JP | 5-055855 A | 3/1993 |
| JP | 06-152317 A | 5/1994 |
| JP | 09-167937 A | 6/1997 |
| JP | 11-346142 A | 12/1999 |
| JP | 2000-022493 A | 1/2000 |
| JP | 2001-186033 A | 7/2001 |
| JP | 2002-76829 A | 3/2002 |
| JP | 2003-249841 A | 9/2003 |
| JP | 2004-523176 A | 7/2004 |
| JP | 2004-336181 A | 11/2004 |
| JP | 2004-349893 A | 12/2004 |
| JP | 2005-184773 A | 7/2005 |
| JP | 2006-60747 A | 3/2006 |
| JP | 2006-135447 A | 5/2006 |
| JP | 2006-135921 A | 5/2006 |
| JP | 2006-311041 A | 11/2006 |
| JP | 2007-312324 A | 11/2007 |
| WO | 02/071610 A1 | 9/2002 |

OTHER PUBLICATIONS

International Search Report (ISR) issued in PCT/JP2008/058416 mailed in Aug. 2008.

* cited by examiner g1: PASS CHARACTERISTIC OF LADDER FILTER    i: PASS CHARACTERISTIC OF CAPACITOR CB
h1: PHASE CHARACTERISTIC OF LADDER FILTER   j: PHASE CHARACTERISTIC OF CAPACITOR CB j : PHASE CHARACTERISTIC OF CAPACITOR CB
g2 : PASS CHARACTERISTIC OF LADDER FILTER WITH BRIDGING CAPACITOR CB
h2 : PHASE CHARACTERISTIC OF LADDER FILTER WITH BRIDGING CAPACITOR CB j : PHASE CHARACTERISTIC OF CAPACITOR CB
g3 : PASS CHARACTERISTIC OF LADDER FILTER WITH PHASE-SHIFT CIRCUIT
h3 : PHASE CHARACTERISTIC OF LADDER FILTER WITH PHASE-SHIFT CIRCUIT g3 : PASS CHARACTERISTIC WHEN BRIDGING CAPACITOR IS NOT ARRANGED
g4 : PASS CHARACTERISTIC WHEN BRIDGING CAPACITOR IS ARRANGED j : PHASE CHARACTERISTIC OF CAPACITOR CB
h41 : PHASE CHARACTERISTIC BETWEEN In AND Out1
h42 : PHASE CHARACTERISTIC BETWEEN In AND Out2 g4 : PASS CHARACTERISTIC WHEN BRIDGING CAPACITOR IS NOT ARRANGED
g5 : PASS CHARACTERISTIC WHEN BRIDGING CAPACITOR IS ARRANGED

FILTER, BRANCHING FILTER AND COMMUNICATION APPARATUS

CROSS-REFERENCE TO RELATED APPLICATIONS

This application is based upon and claims the benefit of priority of the prior Japanese Patent Application No. 2008-198886, filed on Jul. 31, 2008, the entire contents of which are incorporated herein by reference.

FIELD

An aspect of the present invention relates, for example, to a filter, a branching filter, and a communication apparatus connected to an antenna of a wireless communication apparatus as typified by a cellular phone.

BACKGROUND

FIG. 35 is a view illustrating an antenna branching filter. In the antenna branching filter 81, a transmitting filter 82 is coupled between a common terminal Ant and a transmitting terminal Tx, and a receiving filter 83 is coupled between the common terminal Ant and a receiving terminal Rx. When the antenna branching filter 81 is used, for example, in a cellular phone, the common terminal Ant is coupled to an antenna, the transmitting terminal Tx is coupled to a transmitting circuit, and the receiving terminal Rx is coupled to a receiving circuit.

The pass band of the transmitting filter 82 is different from that of the receiving filter 83 and thus a transmit signal inputted to the transmitting terminal Tx is, after passing through the transmitting filter 82, outputted via the common terminal Ant to the antenna without flowing in the receiving filter 83. Then, the transmit signal is converted to radio wave and radiated by the antenna. A receive signal received by the antenna passes through the receiving filter 83 and is inputted via the receiving terminal Rx to the receiving circuit. This is an ideal signal flow in the antenna branching filter.

However, in the actual antenna branching filter, all the transmit signals outputted from the transmitting filter 82 are not outputted via the common terminal Ant to the antenna. A part of the signals flows into the receiving filter 83 and reaches the receiving terminal Rx. Consequently, a receive signal inputted via the receiving terminal Rx by the receiving circuit includes noise, thus degrading the receiving performance.

As a value indicating the extent of suppression of the leaking of the transmit signals inputted from the transmitting circuit to the transmitting terminal Tx to the receiving filter 83 to the receiving terminal Rx, transmission-reception isolation (hereinafter, simply referred as "isolation") is used. Typically, the isolation of an antenna branching filter is approximately 50 dB. The isolation value of 50 dB is, however, not satisfactory for the performance required of an antenna branching filter.

In order to compensate for such receiving performance degradation, a filter is arranged in the receiving circuit. The arrangement increases the size and cost of the apparatus and also makes the apparatus more complex. Consequently, the improvement of isolation in the antenna branching filter has a large effect on cellular phone design.

Thus, Japanese Patent Laid-Open Nos. 2006-60747 and 2002-76829 have discussed an approach for removing unwanted electromagnetic coupling, which is one of the factors causing a transmit signal leakage from the transmitting circuit to the receiving circuit, in an antenna branching filter. According to the Japanese Patent Laid-Open No. 2006-60747, a shield electrode is arranged to remove unwanted electromagnetic coupling. The Japanese Patent Laid-Open No. 2002-76829 discusses an example in which an innovative method of coupling the ground terminal of an antenna branching filter package is used to prevent unwanted electromagnetic coupling.

SUMMARY

According to an aspect of the embodiment, a filter including a converter circuit, provided with a single-type common terminal and two balanced terminals, for performing conversion between a balanced line and an unbalanced line; two filter units each coupled to each of the balanced terminals of the converter circuit and allowing passage of a signal in a pass band; and a bridging capacitor arranged to extend across the converter circuit and one of the filter units in a bridging manner, wherein the inductance of an opposite-side line of one of the filter units relative to the converter circuit is electromagnetically coupled to the inductance of a line coupling the other filter unit and the converter circuit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Figure 1:
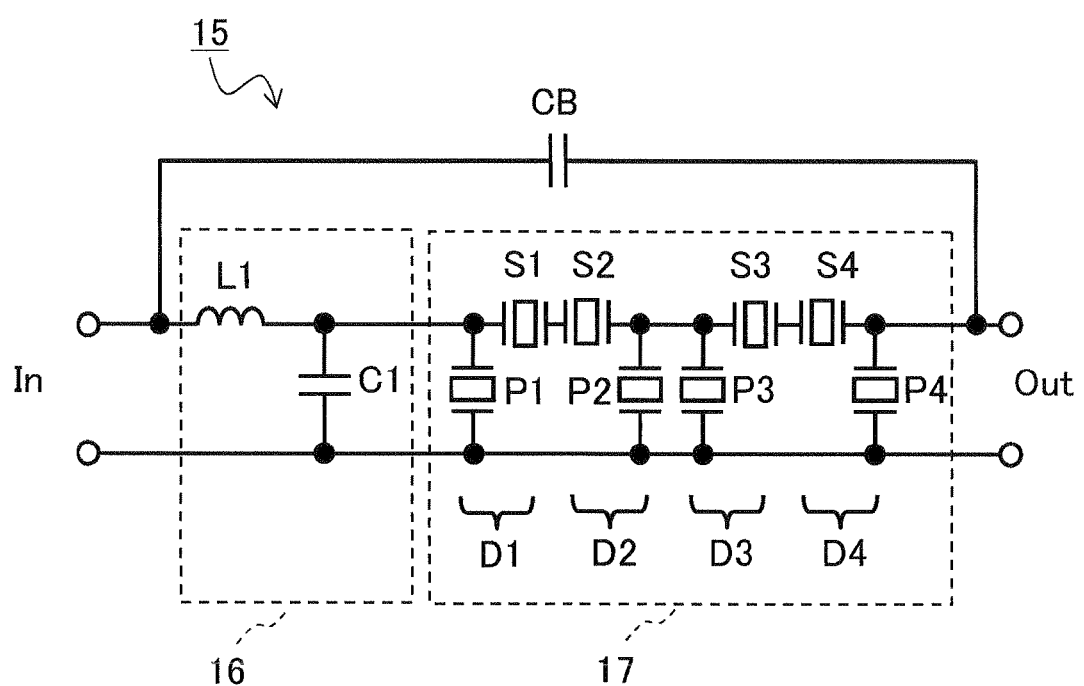
FIG. 1 is a circuit diagram illustrating a filter according to an embodiment.

With just removal of unwanted electromagnetic coupling, the isolation cannot be satisfactorily improved. Thus, according to an aspect of the present invention, leak signals from the transmitting filter are fundamentally attenuated. In order to fundamentally suppress the leak signals, the degree of suppression in the suppressing band of the filter is raised.

Thus, a filter with a high degree of suppression is implemented.

A filter according to an aspect of the present invention includes a converter circuit, two filter units, a bridging capacitor, a single-type common terminal, and two balanced terminals. The converter circuit performs conversion between a balanced line and an unbalanced line. The converter circuit includes two output terminals. The two output terminals are for unbalanced output. The two filter units are coupled to the two respective output terminals of the converter circuit and allow passage of a signal in a pass band. The bridging capacitor is coupled to extend across the converter circuit and one of the filter units in a bridging manner. The inductance of an opposite-side line of one of the filter units relative to the converter circuit is electromagnetically coupled to the inductance of a line coupling the converter circuit and the other filter unit.

The bridging capacitor is arranged to extend across the converter circuit and the filter unit in a bridging manner. In the filter according to an aspect of the present invention, the capacitance of the bridging capacitor and the phase shift angle of the converter circuit are properly set. A signal passing through the bridging capacitor and a signal passing through the filter unit cancel each other in a frequency band (suppressing band) other than the pass band. Accordingly, in the filter according to the aspect of the present invention, a signal in the suppressing band is further suppressed. The filter according to the aspect of the present invention has a high degree of suppression.

Further, the inductance of an opposite-side line of one of the filter units relative to the converter circuit is electromagnetically coupled (inductively coupled) to the inductance of a line coupling the converter circuit to the other filter unit. Accordingly, the inductance of the filter unit across which the bridging capacitor extends is prevented from exerting effects on the suppression characteristic of the filter.

According to the aspect of the present invention, a transmit signal leaking from the transmitting filter to the receiving filter side is fundamentally attenuated to improve the isolation.

In the converter circuit according to an aspect of the present invention, the phase shift angle is preferably set so that a signal outputted via the bridging capacitor has a phase opposite to that of a signal outputted via the converter circuit and one of the filter units in a band other than the pass band of the filter unit.

Accordingly, in a band other than the pass band of the filter unit, a signal passing through the bridging capacitor has a phase opposite to that of a signal passing through the filter unit; thus the two signals cancel each other out. Accordingly, the output signal level is small in a band (a suppressing band) other than the pass band. That is, the suppressing band has an attenuation pole; consequently, the degree of suppression of the filter rises.

The filter according to an aspect of the present invention is formed on a package or a substrate. Inductance coupling of the filter unit may be implemented by a transmission line on the package or the substrate.

When the inductance coupling is implemented by a transmission line on the package or the substrate, there is no need for an additional part or fabrication process. Accordingly, the degree of suppression is raised without hindering downsizing and cost reduction.

The filter according to an aspect of the present invention is formed on a substrate including multiple layers. At least one of an opposite-side line of one of the filter units relative to the converter circuit and a line coupling the other filter unit and the converter circuit is formed in at least one layer of the substrate. In that section of a layer neighboring the layer where the line is formed and which overlaps the line in a stacking direction, a ground metal pattern coupled to the ground is removed.

The removal of the ground metal pattern in the layer neighboring the line having inductance facilitates the inductance to readily couple electromagnetically to the line inductance of the other filter unit. That is, the coupling is implemented by the wiring pattern of lines on the substrate and the ground metal pattern.

According to an aspect of the present invention, the ground metal pattern coupled to the ground is disposed over most of the area of the layer neighboring the layer where the line is formed; and the ground metal pattern is removed in the section which overlaps the line in a stacking direction.

In order to maintain the filter characteristic, the line resistance and inductance in each layer of the substrate are preferably small. The ground metal pattern is formed as wide as possible, and the section thereof overlapping the line having inductance is removed. Thus, according to an aspect of the present invention, the suppression characteristic of the filter is improved while suppressing the line resistance and inductance to a small value.

The width of the ground metal pattern removed according to an aspect of the present invention is preferably the same or greater than the width of the line passing through the neighboring layer, and the same or smaller than twice the width of the line.

The width of the ground metal pattern removed is preferably the same or greater than the width of the line, and the same or smaller than twice the width of the line from a viewpoint of accuracy when forming the ground metal pattern, and is preferably equal to the width of the line from a viewpoint of the improvement of the suppression characteristic of filter by coupling.

The branching filter according to an aspect of the present invention includes a single-type common terminal, a transmitting terminal, and a balanced receiving terminal. The branching filter includes a transmitting filter coupled between the common terminal and transmitting terminal, and a receiving filter coupled between the common terminal and receiving terminal. The receiving filter is the above described filter.

In the branching filter, a transmit signal inputted to the transmitting terminal passes through the transmitting filter and is outputted via the common terminal. In this case, a part of the transmit signal is not outputted via the common terminal and leaks to the receiving filter side. The transmit signal leaking to the receiving filter side passes through the converter circuit and the filter unit and is phase-adjusted, and reaches the receiving terminal. At the same time, the leaked transmit signal passes through the bridging capacitor and reaches the receiving terminal. That is, the leaked transmit signal skips the converter circuit and the filter unit and reaches the receiving terminal. Consequently, when the phase-shift angle of the converter circuit is properly set, the transmit signal received via the bridging capacitor and the phase-adjusted transmit signal received via the converter circuit and the filter unit cancel each other out at the receiving terminal. That is, in the branching filter, when the phase-shift angle of the converter circuit is properly set, the transmit signal leaking to the receiving filter side and reaching the receiving terminal is fundamentally attenuated. As a result, the branching filter with improved isolation may be implemented.

The bridging capacitor according to the aspect of the present invention is formed within a package or on a substrate having a converter circuit and filter unit formed therein.

Accordingly, the degree of suppression is improved while the small size of filter is maintained.

The transmitting filter and the receiving filter according to an aspect of the present invention are included in the package. A line in the package is used for coupling through reactance. Consequently, the isolation is improved while the small size of the branching filter is maintained.

A module including a branching filter is also included in an aspect of the present invention in which a receiving filter and a transmitting filter of the branching filter are mounted on a substrate included in the module, and coupling through reactance (bridging capacitance) is implemented by a line in the substrate. Consequently, the module including the branching filter with the isolation improved is implemented while the small size of the module is maintained. Further, a communication apparatus including the module is also included in an aspect of the present invention.

FIG. 1 is a circuit diagram describing a filter according to the embodiment. A phase-shift circuit 16 and a filter unit 17 are coupled between an input terminal In and an output terminal Out of a filter 15 illustrated in FIG. 1. Further, a bridging capacitor CB, which couples a node between the input terminal In and the phase-shift circuit 16 to a node between the filter unit 17 and the output terminal Out in a bridging manner, is arranged in the filter 15.

The phase-shift circuit 16 includes a coil L1 coupled in series and a capacitor C1 coupled in parallel. The filter unit 17 is a ladder filter in which four-stage filter elements D1 to D4 are coupled. The filter elements D1 to D4 include series resonators S1 to S4 and parallel resonators P1 to P4.

In the filter 15, the degree of suppression in the suppressing band may be improved to implement an excellent filter characteristic. The principle will be described below.

Figure 2A:
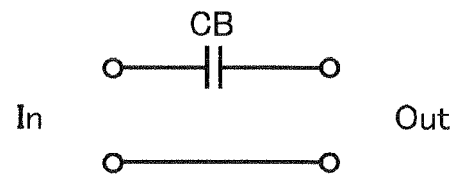
FIG. 2A is a circuit diagram illustrating a capacitor CB.
Figure 2B:
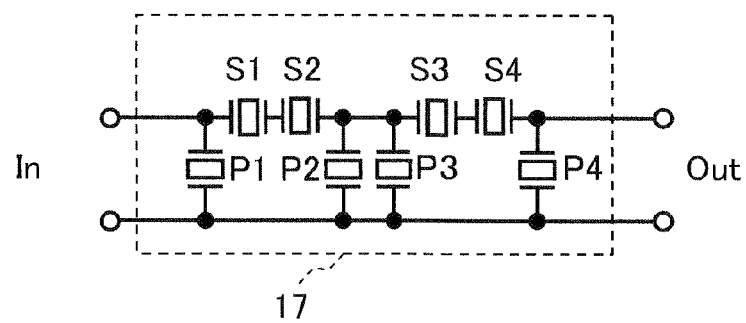
FIG. 2B is a circuit diagram illustrating a filter unit (ladder filter)
Figure 2C:
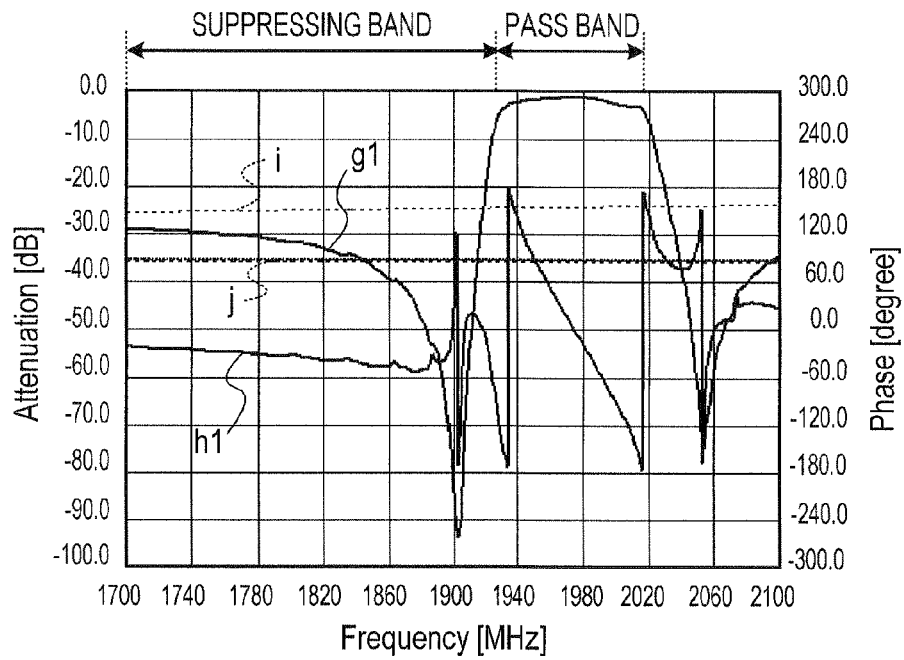
FIG. 2C is a graph illustrating the pass characteristic and phase characteristic of the capacitor CB of FIG. 2A and the filter unit of FIG. 2B.

FIG. 2A is a view illustrating a circuit in which the capacitor CB is coupled in series between the input terminal In and the output terminal Out. FIG. 2B is a view illustrating a circuit in which the filter unit 17 (ladder filter) is coupled in series between the input terminal In and the output terminal Out. FIG. 2C is a graph illustrating the pass characteristic and phase characteristic of the capacitor CB illustrated in FIG. 2A and the pass characteristic and phase characteristic of the filter unit illustrated in FIG. 2B.

Referring to the graph illustrated in FIG. 2C, the abscissa indicates frequency; the ordinate on the left side indicates attenuation [dB]; and the ordinate on the right side indicates phase [°]. Referring to FIG. 2C, the solid line g1 indicates the pass characteristic of the filter unit 17 illustrated in FIG. 2B; the solid line h1, the phase characteristic of the filter unit 17; the broken line i, the pass characteristic of the capacitor CB illustrated in FIG. 2A; the broken line j, the phase characteristic of the capacitor CB. In the example illustrated in FIG. 2C, in the suppressing band with a frequency lower than the pass band (from about 1700 MHz to about 1920 MHz), it may be seen that the phase of the filter unit 17 is about −20° to −50° and the phase of the capacitor CB is about 85°.

Figure 3A:
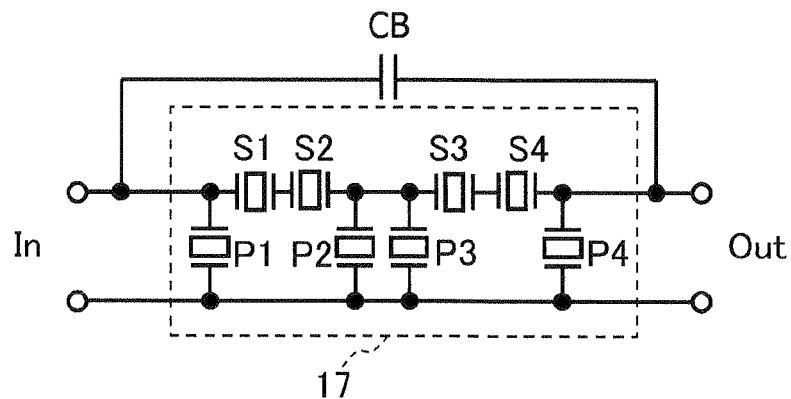
FIG. 3A is a view illustrating a circuit of the capacitor CB of FIG. 2A bridging the filter unit 17 of FIG. 2B.

FIG. 3A is a view illustrating a circuit in which the capacitor CB of FIG. 2A bridges the input terminal In and the output terminal Out of the filter unit 17 of FIG. 2B. That is, FIG. 3A illustrates a circuit in which the capacitor CB of a capacitance of 0.05 pF is added between the input and output terminals of a ladder filter.

Figure 3B:
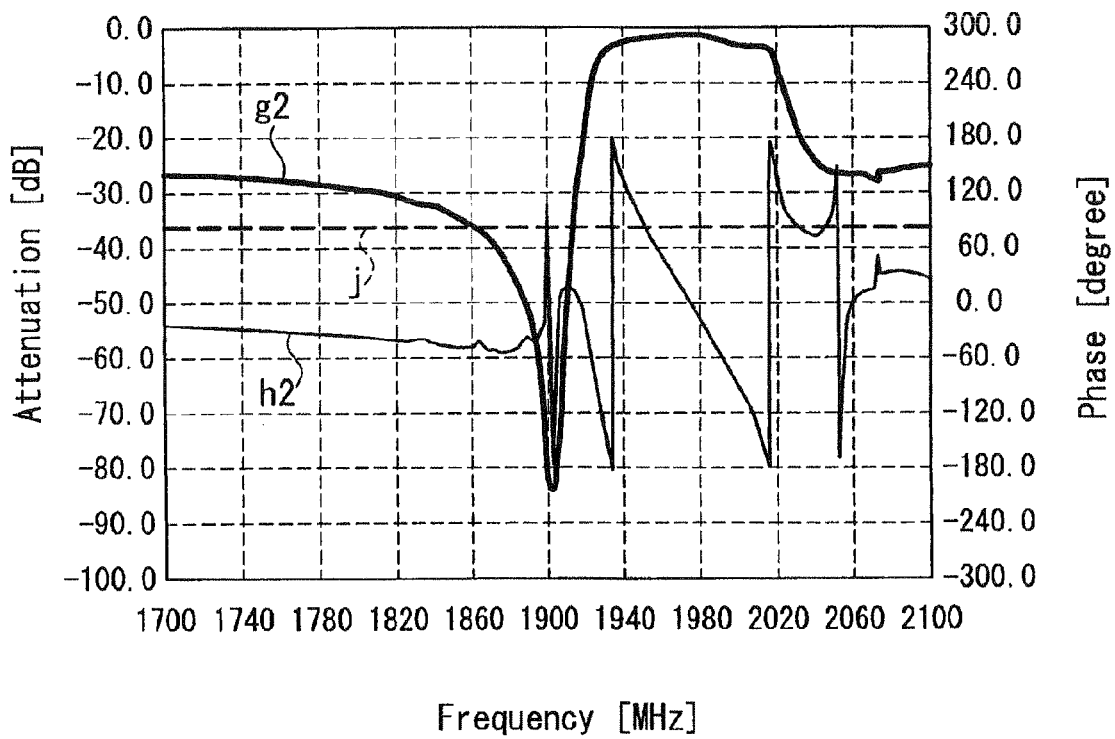
FIG. 3B is a graph illustrating the pass characteristic and phase characteristic of the circuit illustrated in FIG. 3A.

FIG. 3B is a graph illustrating the pass characteristic and phase characteristic of the circuit illustrated in FIG. 3A. Referring to FIG. 3B, the solid line g2 indicates the pass characteristic, and the solid line h2 indicates the phase characteristic. For reference, the phase characteristic of the capacitor CB of FIG. 2A is also indicated by the broken line j. Referring to FIG. 3B, the difference of phase between the current passing through the capacitor CB and the current passing through the filter unit 17 is about 105° to 135° in the suppressing band on the low frequency side of the pass band.

Here, when the above difference of phase is set to 180° in the suppressing band, it is expected that the current of the bridging capacitor CB and the current of the filter unit 17 cancel each other out so that the degree of suppression is improved in the suppressing band. Thus, consider that the phase of current passing through the filter unit 17 is varied to have a phase opposite to that of the current passing through the bridging capacitor CB.

Figure 4A:
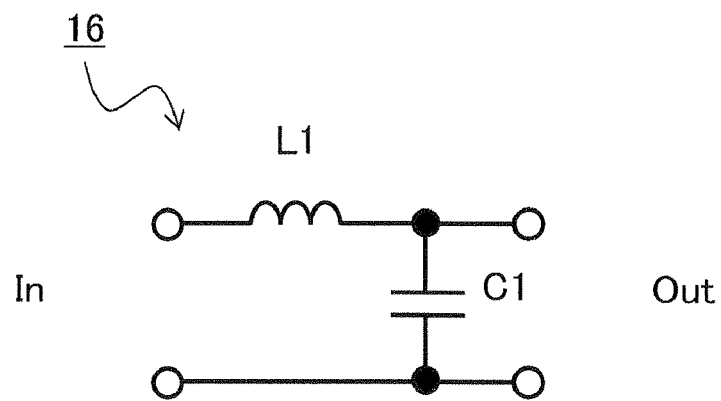
FIG. 4A is a view illustrating a phase-shift circuit.
Figure 4B:
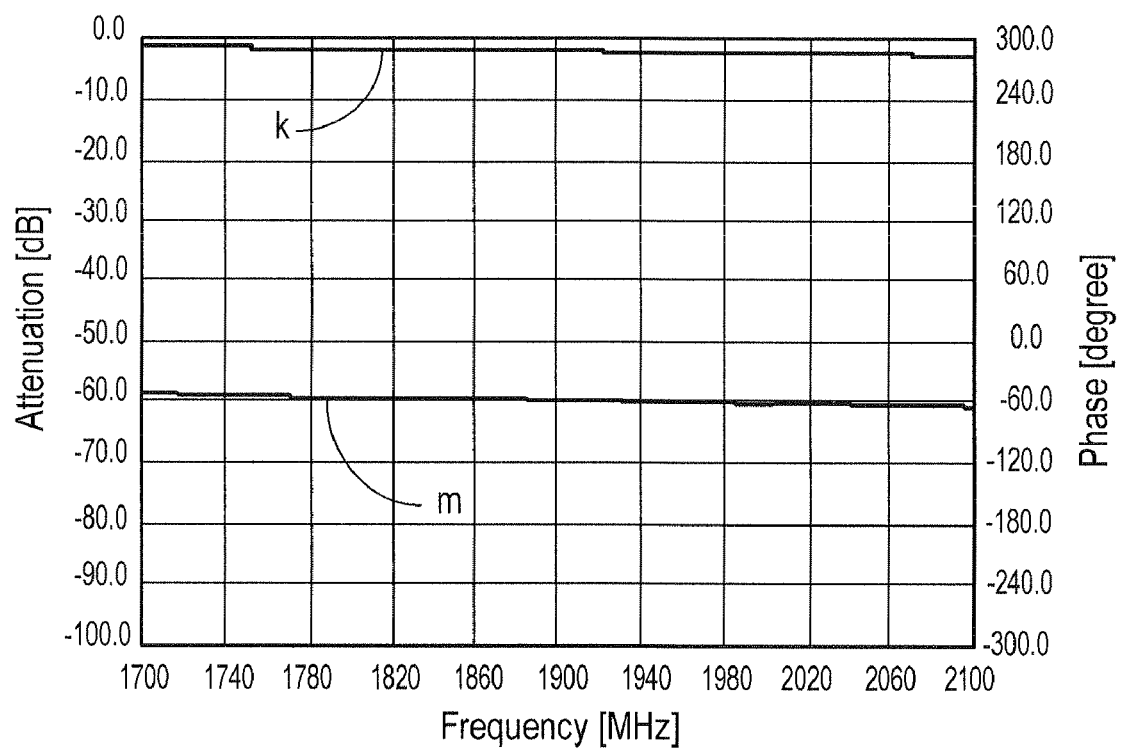
FIG. 4B is a view illustrating the pass characteristic and phase characteristic of the phase-shift circuit of FIG. 4A.

For example, when the phase-shift circuit (phase delay circuit) 16 as illustrated in FIG. 4A is coupled to the filter unit 17, the output phase is varied. The phase-shift circuit 16 includes a coil L1 (series inductor) coupled in series and a capacitor C1 (parallel capacitor) coupled in parallel between the input terminal In and the output terminal Out. FIG. 4B is a view illustrating the pass characteristic (the solid line k) and the phase characteristic (the solid line m) of the phase-shift circuit 16 where the inductance of the coil L1 is 5.74 nH and the capacitance of the capacitor C1 is 1.15 pF. The phase characteristic is about −60°. When the phase-shift circuit 16 is coupled to the filter unit 17, the phase of the current passing through the filter unit 17 varies about −60°.

Figure 5A:
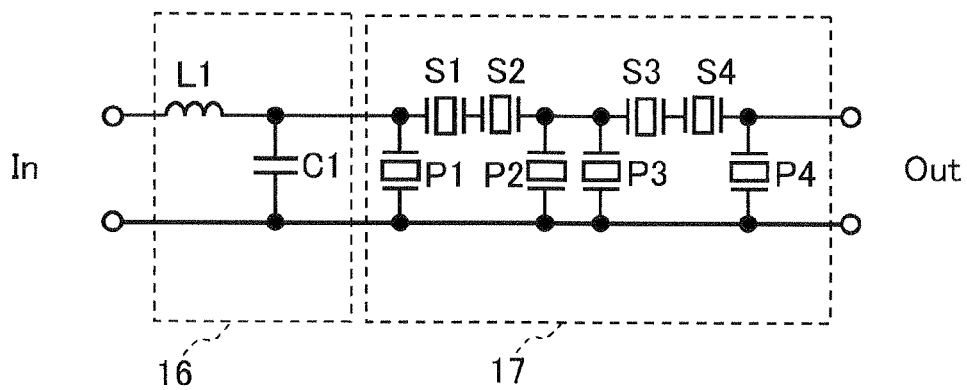
FIG. 5A is a view illustrating a circuit in which the phase-shift circuit is added to the input side of the filter unit.
Figure 5B:
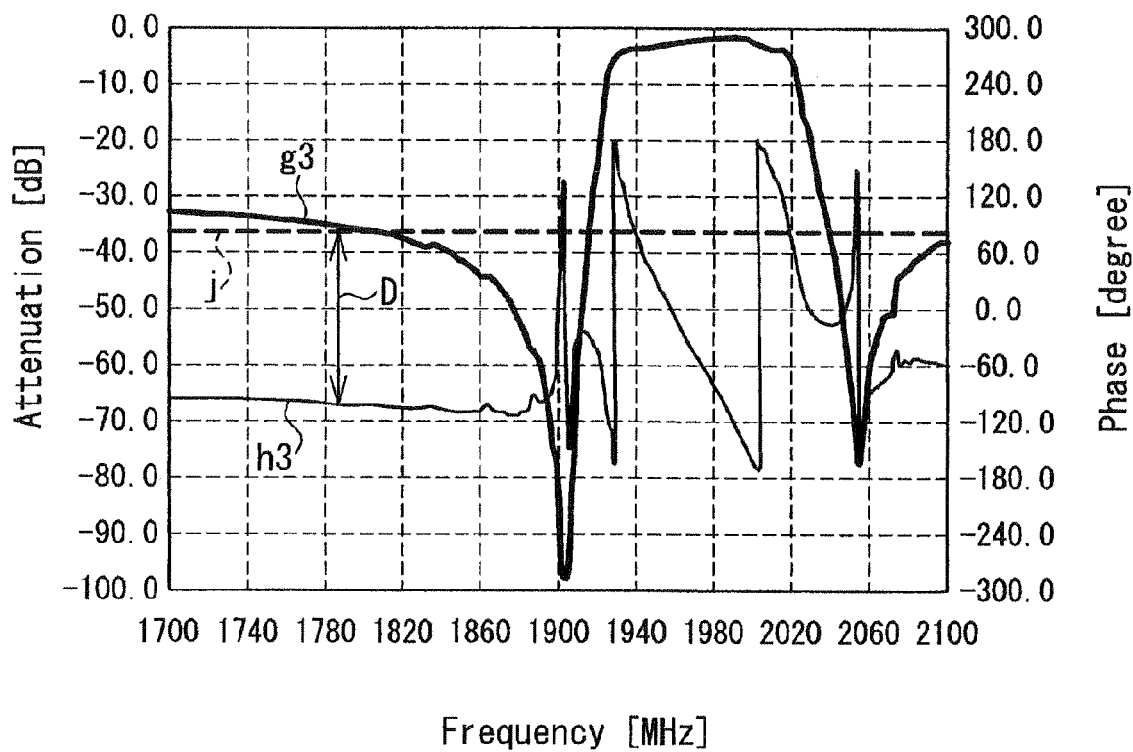
FIG. 5B is a graph illustrating the pass characteristic and phase characteristic of the circuit illustrated in FIG. 5A.

FIG. 5A is a view illustrating a circuit in which the phase-shift circuit 16 is added to the input side of the filter unit 17. FIG. 5B is a graph illustrating the pass characteristic (the solid line g3) and the phase characteristic (the solid line h3) of the circuit of FIG. 5A. The broken line j of FIG. 5B indicates the phase characteristic of the capacitor CB of FIG. 2A. From FIG. 5B, it may be seen that when the phase-shift circuit 16 is added to the filter unit 17, the phase varies about −60°, and the phase in the suppressing band on the low frequency side of the pass band is about −80° to −110°.

The difference D between the phase of the phase-shift circuit 16 and filter unit 17 indicated by the solid line h3 and the phase of the bridging capacitor CB indicated by the broken line j is about 180° at around 1790 MHz in the graph of FIG. 5B. That is, the difference D between the two phases is about 180° (opposite phase) in the suppressing band on the low frequency side of the pass band.

Thus, when the bridging capacitor CB extending from the input terminal In to the output terminal Out is added to the circuit illustrated in FIG. 5A to make a circuit illustrated in FIG. 1, the output signal is attenuated in the suppressing band. That is, the current passing through the bridging capacitor CB and the current passing through the phase-shift circuit 16 and filter unit 17 have a phase opposite to each other and cancel each other out in the suppressing band, so that the output signal is attenuated (i.e., the suppressing band has an attenuation pole).

Figure 6A:
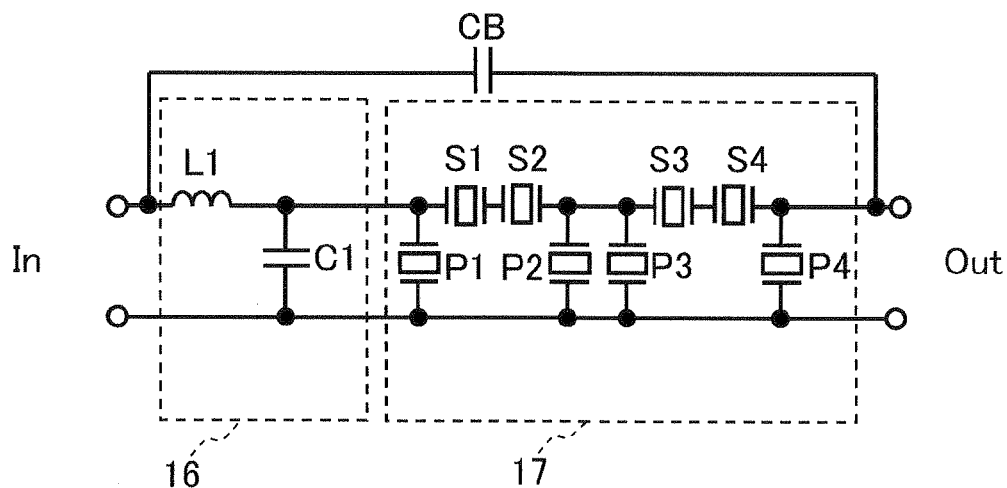
FIG. 6A is a view illustrating a circuit in which the bridging capacitor CB is added to the circuit of FIG. 5A.
Figure 6B:
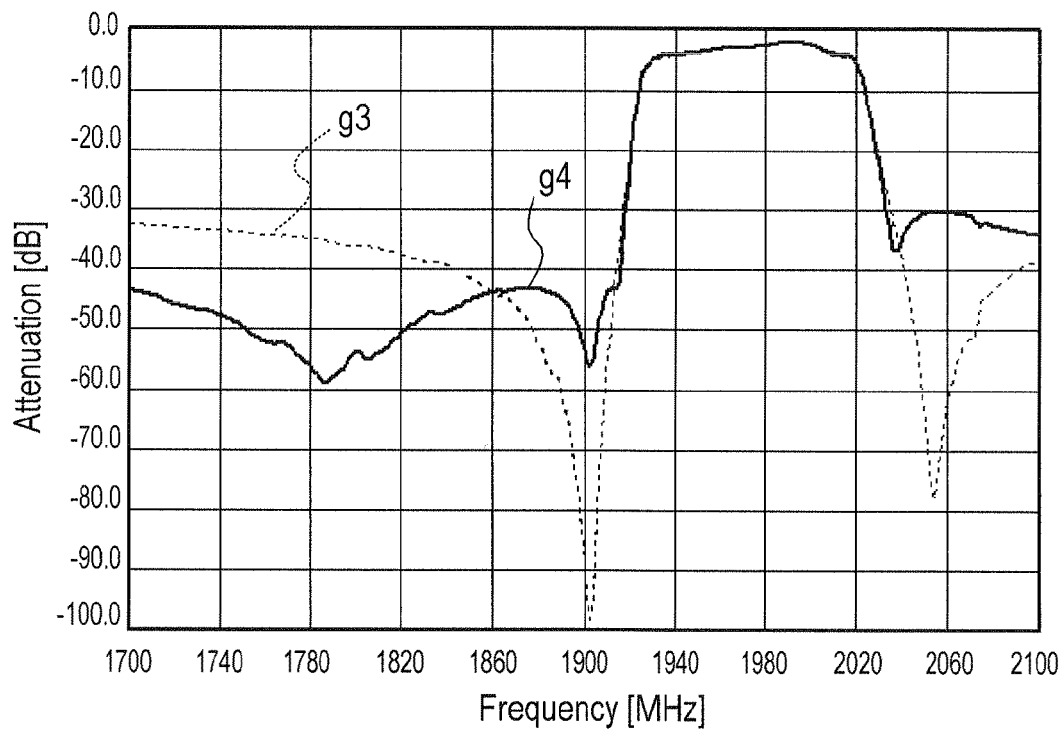
FIG. 6B is a graph illustrating the pass characteristic of the circuit illustrated in FIG. 6A.

FIG. 6A is a view illustrating a circuit in which the bridging capacitor CB is added to the circuit illustrated in FIG. 5A. FIG. 6B is a graph illustrating the pass characteristic (the solid line g4) of the circuit illustrated in FIG. 6A. Referring to the graph of FIG. 6B, an attenuation pole is produced at around 1790 MHz as expected, so that the degree of suppression of the filter is improved in the frequency band on the low frequency side of the pass band. In this way, an attenuation pole is produced in the suppressing band, whereby the filter with a high degree of suppression may be implemented.

Here, when the capacitance value of the bridging capacitor CB is varied, the phase of the current passing through the bridging capacitor CB varies. Accordingly, the frequency of the attenuation pole may be controlled by varying the capacitance value of the bridging capacitor CB.

Figure 7A:
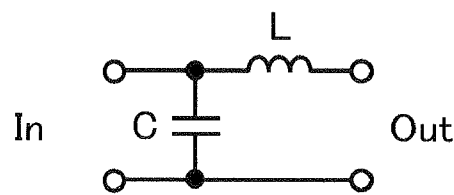
FIGS. 7A to 7C are each a view illustrating an example of a phase-shift circuit.
Figure 7B:
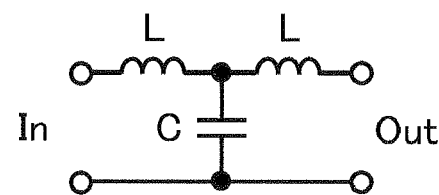
Figure 7C:
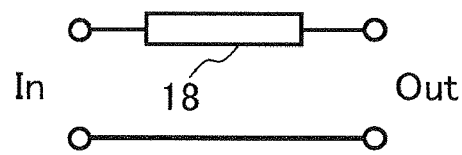

As the phase-shift circuit (phase varying element) 16, other than the one illustrated in FIG. 4A, circuits illustrated in FIGS. 7A to 7C may be used, for example. In both the phase-shift circuits illustrated in FIGS. 7A and 7B, a coil L is coupled in series, and a capacitor C is coupled in parallel. The circuit of FIG. 7B is what is called an LCL-T circuit. The coil L and the capacitor C may be implemented by a chip component, an integrated passive device (IPD), or the like. Alternatively, the phase-shift circuit is, as illustrated in FIG. 7C, implemented by a transmission line 18 such as a distributed constant type strip line or microstrip line.

Figure 8A:
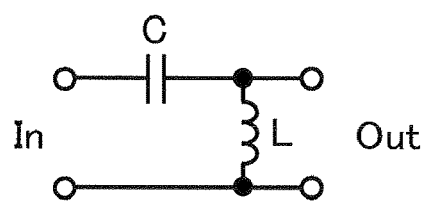
FIGS. 8A to 8D are each a view illustrating an example of a phase-shift circuit.
Figure 8B:
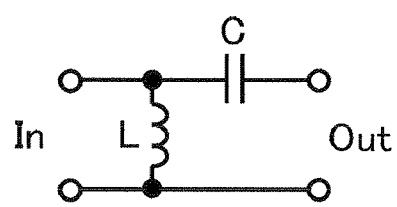
Figure 8C:
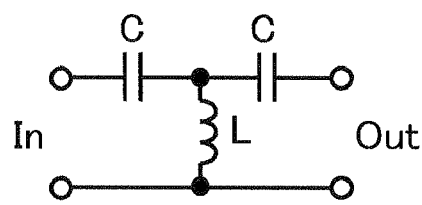
Figure 8D:
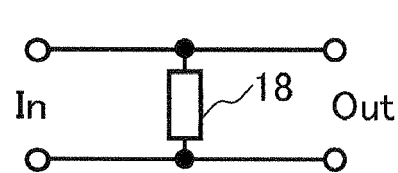

In the phase-shift circuit, a phase delay or a phase advance may be made depending on an initial phase in the suppressing band of the filter. When the phase is advanced, the phase-shift circuits illustrated in FIGS. 8A to 8D are used, for example. In all the phase-shift circuits of FIGS. 8A to 8C, the capacitor C is coupled in series, and the coil L is coupled in parallel. The phase-shift circuit of FIG. 8D is implemented by the transmission line 18.

The above described phase-shift circuits may be used in other embodiments, and the phase-shift circuits illustrated in FIGS. 4A, 7A to 7C and 8A to 8D may be used as the phase-shift circuit of the present embodiment.

Figure 9:
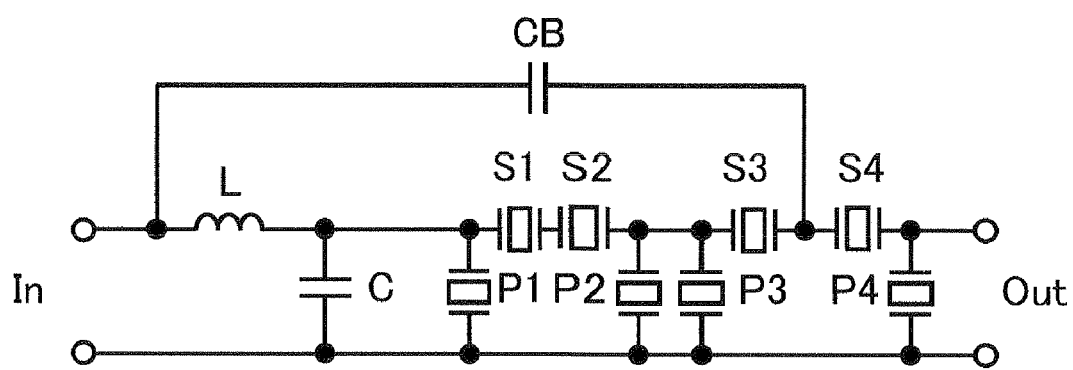
FIG. 9 is a view illustrating a circuit obtained by adding a bridging capacitor CB so that the bridging capacitor CB extends across the phase-shift circuit 16 and a part of the filter unit 17 in a bridging manner.

FIG. 9 illustrates an example in which the coupling position of the bridging capacitor CB is changed. Reference characters L and C denote a phase-shift circuit, reference characters S1 to S4 denote series resonators of the ladder filter, and reference characters P1 to P4 denote parallel resonators of the ladder filter. The filter unit 17 is a ladder filter including S1 to S4 and P1 to P4. Instead of adding the bridging capacitor CB in the outermost part of the phase-shift circuit 16 and filter unit 17, the bridging capacitor CB may be, for example, as illustrated in FIG. 9, added to connect the input terminal In of the phase-shift circuit 16 with an intermediate part of the filter unit 17 in a bridging manner. In the example of FIG. 9, the bridging capacitor CB is arranged to extend across a part of the filter unit 17 and the phase-shift circuit 16 in a bridging manner. In this case, also, the degree of suppression of the filter is raised in the same way as described above.

Figure 10:
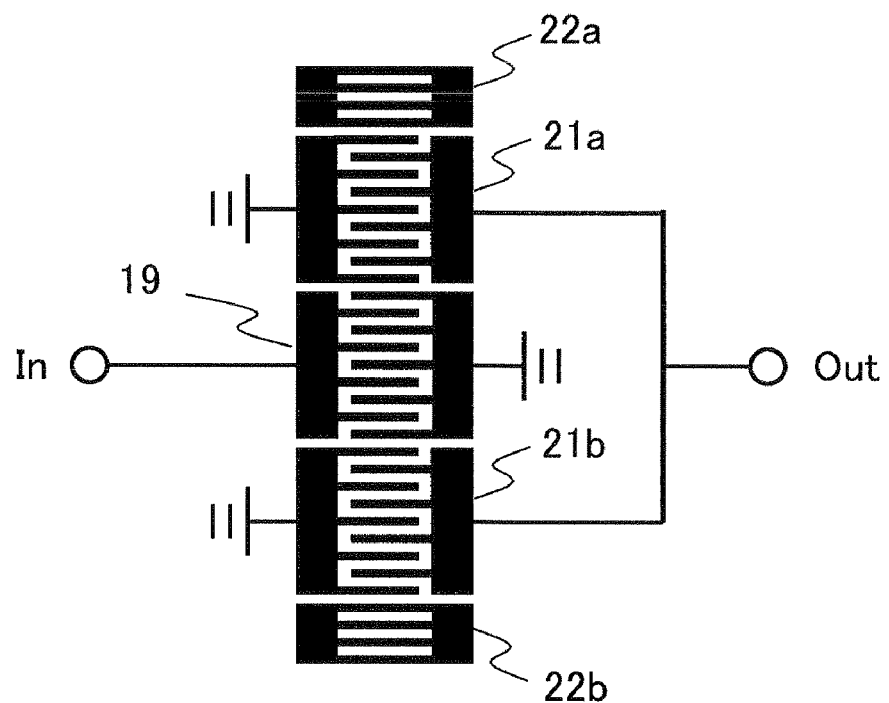
FIG. 10 is a view illustrating an example of double-mode surface acoustic wave filter.

In the present embodiment, a case has been described in which a ladder filter is used as the filter unit 17, but any other type of filter may be used as the filter unit 17. For example, a double-mode surface acoustic wave filter may be used as the filter unit 17. FIG. 10 is a view illustrating a double-mode surface acoustic wave filter. The double-mode surface acoustic wave filter of FIG. 10 includes an input Inter Digital Transducer (IDT) 19 coupled to an input terminal In, output IDTs 21a and 21b arranged in both sides of the input IDT 19, and reflectors 22a and 22b arranged in the outer side of the output IDTs 21a and 21b. An output terminal Out is coupled to the output IDTs 21a and 21b.

The bridging capacitor CB may be implemented using a chip component or an IPD, or formed on a filter chip. Alternatively, as described below, the bridging capacitor CB may be formed in a package or a substrate on which the filter is mounted.

FIG. 11 illustrates an embodiment in which the filter illustrated in FIG. 1 is applied to a balanced filter.

Figure 11A:
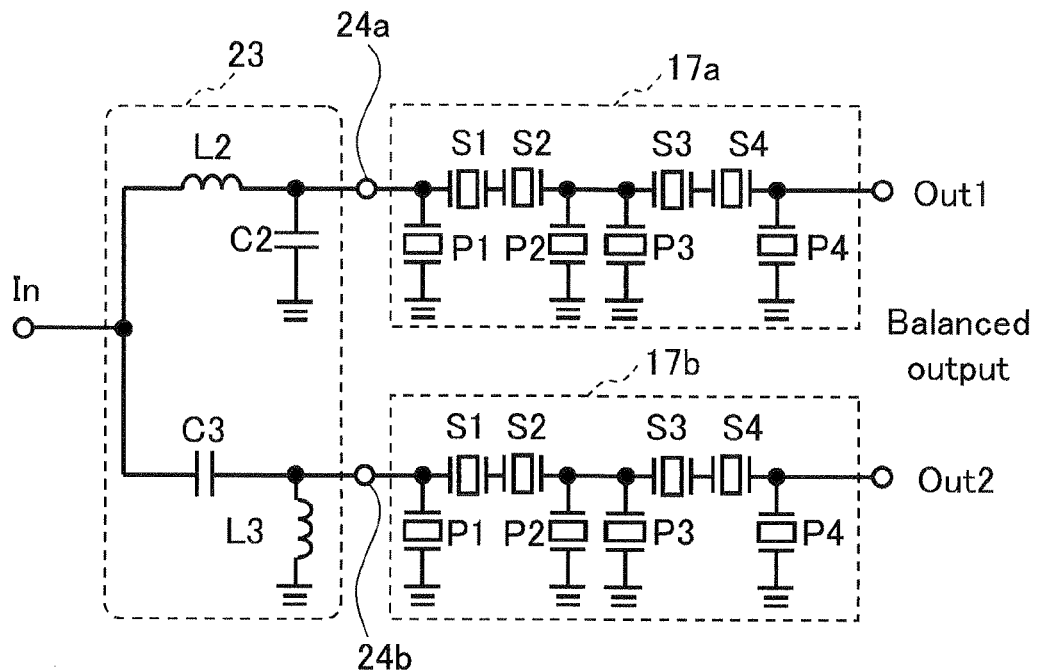
FIG. 11A is a view illustrating a balanced filter circuit to which the bridging capacitor is not added.

FIG. 11A is a view illustrating a balanced filter to which the bridging capacitor CB is not added. The balanced filter includes a balun 23 and filter units (ladder filters) 17a and 17b. The balun 23 is a balance-unbalance converter including a common terminal (input terminal In), an output terminal 24a via which a phase of a signal inputted to the common terminal is delayed about 90°, and an output terminal 24b via which a phase of a signal inputted to the common terminal is advanced about 90°. Referring to the example of FIG. 11A, the balun 23 includes coils L2 and L3 and capacitors C2 and C3. The two output terminals 24a and 24b of the balun 23 are coupled to the filter units 17a and 17b, respectively. These circuits constitute an unbalanced-input-to-balanced-output balanced filter. The filter units 17a and 17b are the same as the filter unit 17 of FIG. 1.

In the balanced filter illustrated in FIG. 11A, the phase-shift circuit and the filter unit 17a are coupled in the path between the input terminal In and the output terminal Out1, and the phase-shift circuit and the filter unit 17b are coupled in the path between the input terminal In and the output terminal Out2. Accordingly, when the bridging capacitor CB is added to one of the paths, an improvement in the degree of suppression is achieved.

Figure 11B:
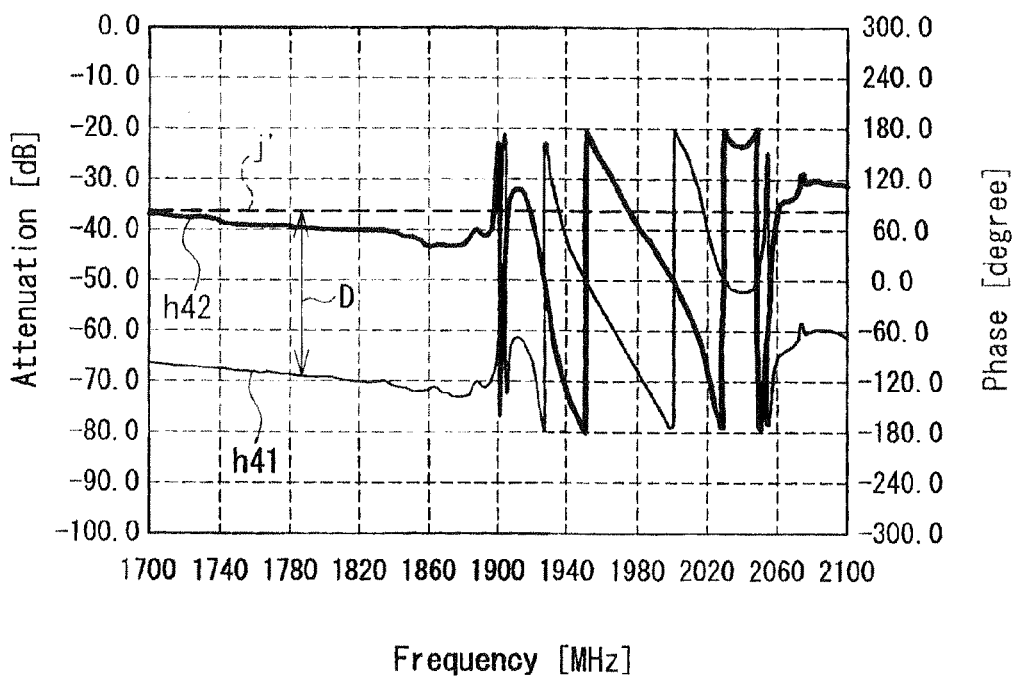
FIG. 11B is a graph illustrating the phase characteristic of the balanced filter of FIG. 11A.

FIG. 11B is a graph illustrating the phase characteristic (the solid line h41) between the input terminal In and the output terminal Out1 of the balanced filter of FIG. 11A and the phase characteristic (the solid line h42) between the input terminal In and the output terminal Out2 of the balanced filter of FIG. 11A. The graph of FIG. 11B is a result of calculation where the inductance of the coil L2 and L3 of the balun 23 is 5.74 nH and the capacitance of the capacitors C2 and C3 is 1.15 pF. The phase characteristic (the broken line i) of the capacitor CB (capacitance=0.05 pF) illustrated in FIG. 2A is also illustrated in the graph. In the phase characteristic of the frequency band on the low frequency side of the pass band, the difference D between the phase of the capacitor CB and the phase between the input terminal In and output terminal Out1 is about 180° (opposite phase) at around 1790 MHz. Consequently, when the bridging capacitor CB of about 0.05 pF is, as illustrated in FIG. 12, added between the input terminal In and the output terminal Out1, the suppression characteristic between the input terminal In and output terminal Out1 has an attenuation pole, thus improving the degree of suppression.

Figure 12:
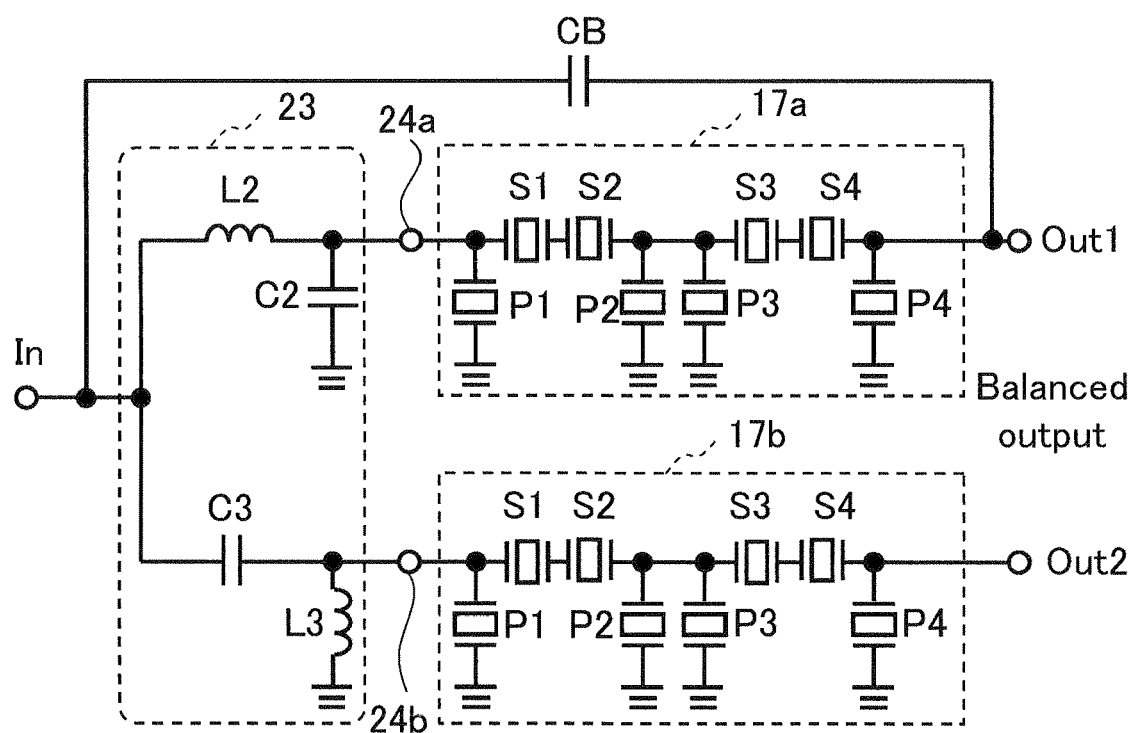
FIG. 12 is a view illustrating a balanced filter circuit according to the embodiment.
Figure 13A:
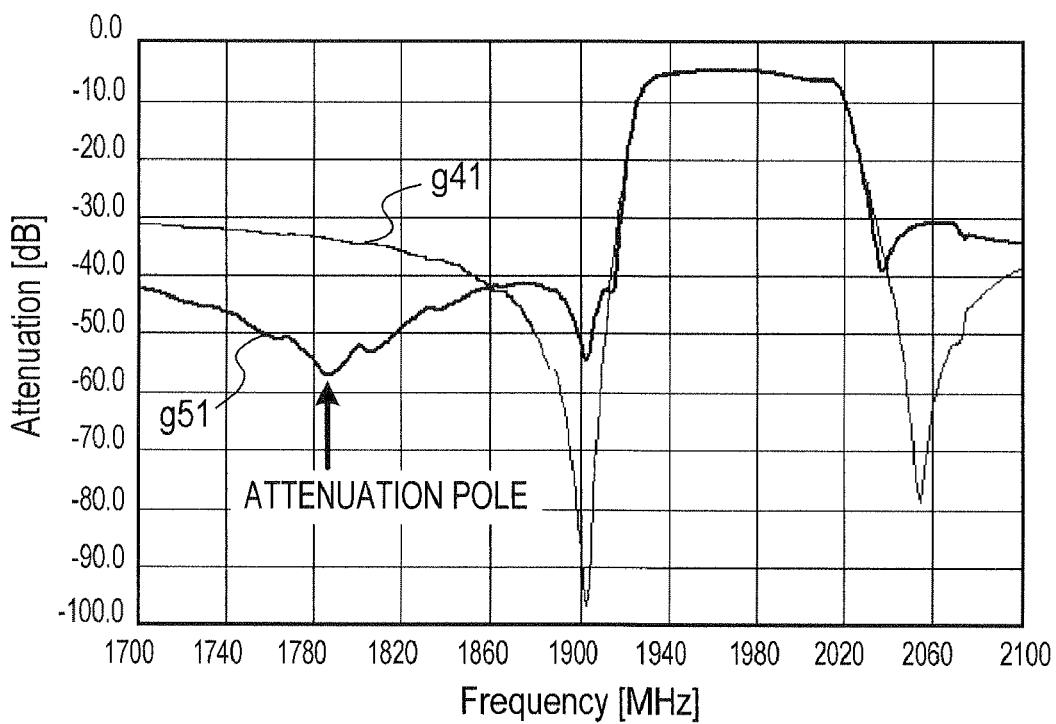
FIG. 13A is a graph illustrating a result of calculating the pass characteristic between an input terminal In and an output terminal Out1 in the balanced filter of FIG. 12.
Figure 13B:
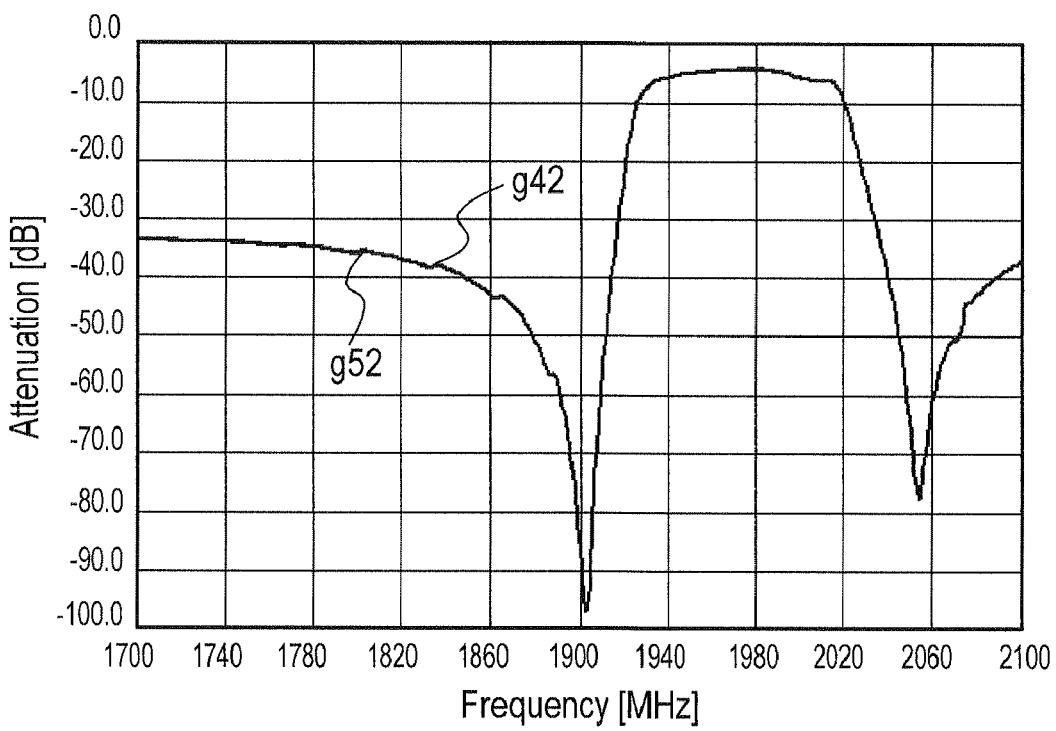
FIG. 13B is a graph illustrating a result of calculating the pass characteristic between the input terminal In and an output terminal Out2 in the balanced filter of FIG. 12.
Figure 14:
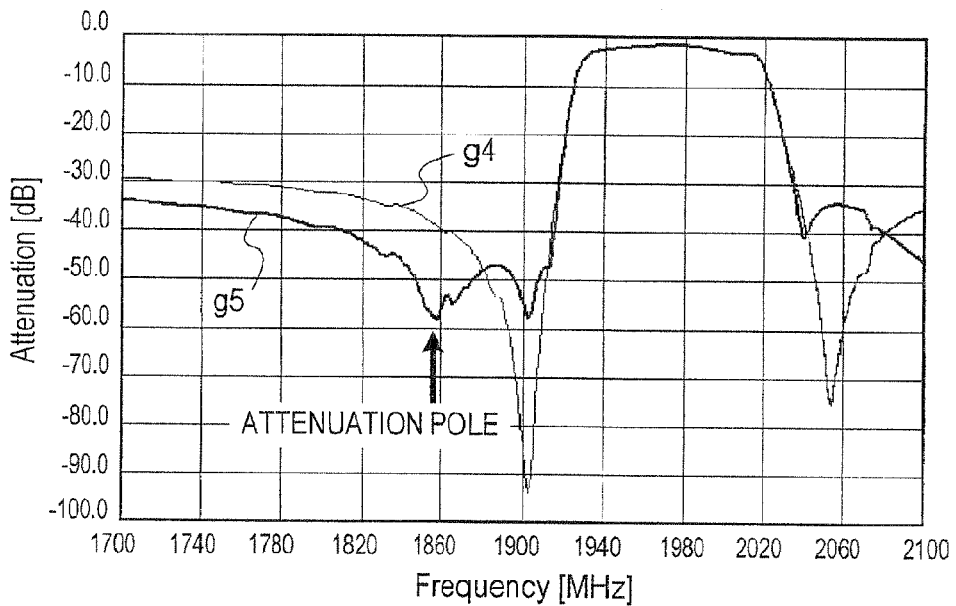
FIG. 14 is a graph illustrating a result of calculating the pass characteristic when the balanced filter of FIG. 12 is balance-combined and analyzed as a single-ended filter.

That is, FIG. 12 is a view illustrating the balanced filter circuit according to the embodiment. FIG. 13A is a graph illustrating a result of calculating the pass characteristic (the solid line g51) between the input terminal In and the output terminal Out1 in the balanced filter illustrated in FIG. 12. In this graph, the pass characteristic (the solid line g41) of the balanced filter illustrated in FIG. 11A to which the bridging capacitor CB is not added is also illustrated. Referring to FIG. 13A, with the bridging capacitor CB added, the pass characteristic between the input terminal In and the output terminal Out1 has an attenuation pole at around 1790 MHz. As a result, the degree of suppression is improved in the frequency band on the low frequency side of the pass band. FIG. 13B is a graph illustrating a result of calculating the pass characteristic (the solid line g52) between the input terminal In and the output terminal Out2. The solid line g52 is identical to the pass characteristic (the solid line g42) where the bridging capacitor CB is not added. That is, the same pass characteristic is obtained independently of whether the bridging capacitor CB is added or not. FIG. 14 is a graph illustrating a result of calculating the pass characteristic when the balanced filter of FIG. 12 is balance-combined and analyzed as a single-ended filter. The solid line g4 indicates the pass characteristic when the bridging capacitor CB is not added. The solid line g5 indicates the pass characteristic when the bridging capacitor CB is added. When the bridging capacitor CB is added, the attenuation pole moves to around 1860 MHz. Also from the analysis of the balanced combination, it may be seen that when the bridging capacitor CB is added, the degree of suppression is raised in the frequency band on the low frequency side of the pass band.

Figure 15:
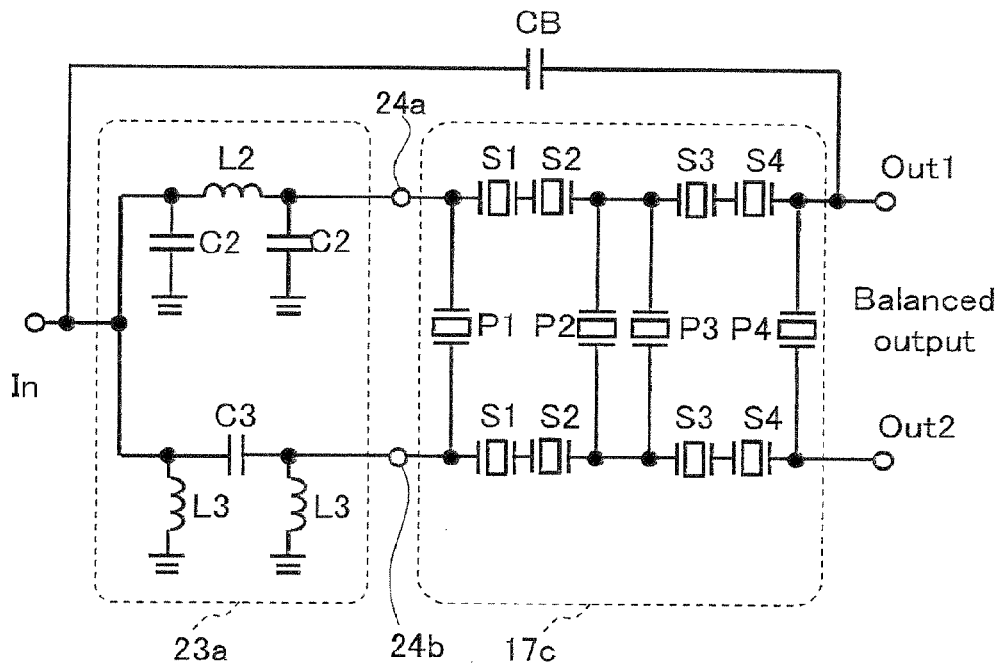
FIG. 15 is a view illustrating a balanced filter circuit according to another embodiment.

FIG. 15 is a view illustrating a variation of the balanced filter according to the present embodiment. In the variation, the balanced filter includes a balun 23a and a balanced-input/balanced-output ladder filter 17c coupled to output terminals 24a and 24b of the balun 23a. In the ladder filter 17c, parallel resonators P1 to P4 are coupled so as to link two paths in which series resonators S1 to S4 are coupled. By way of example, a π-type circuit of CLC and a π-type circuit of LCL are used in the balun 23a.

Figure 16:
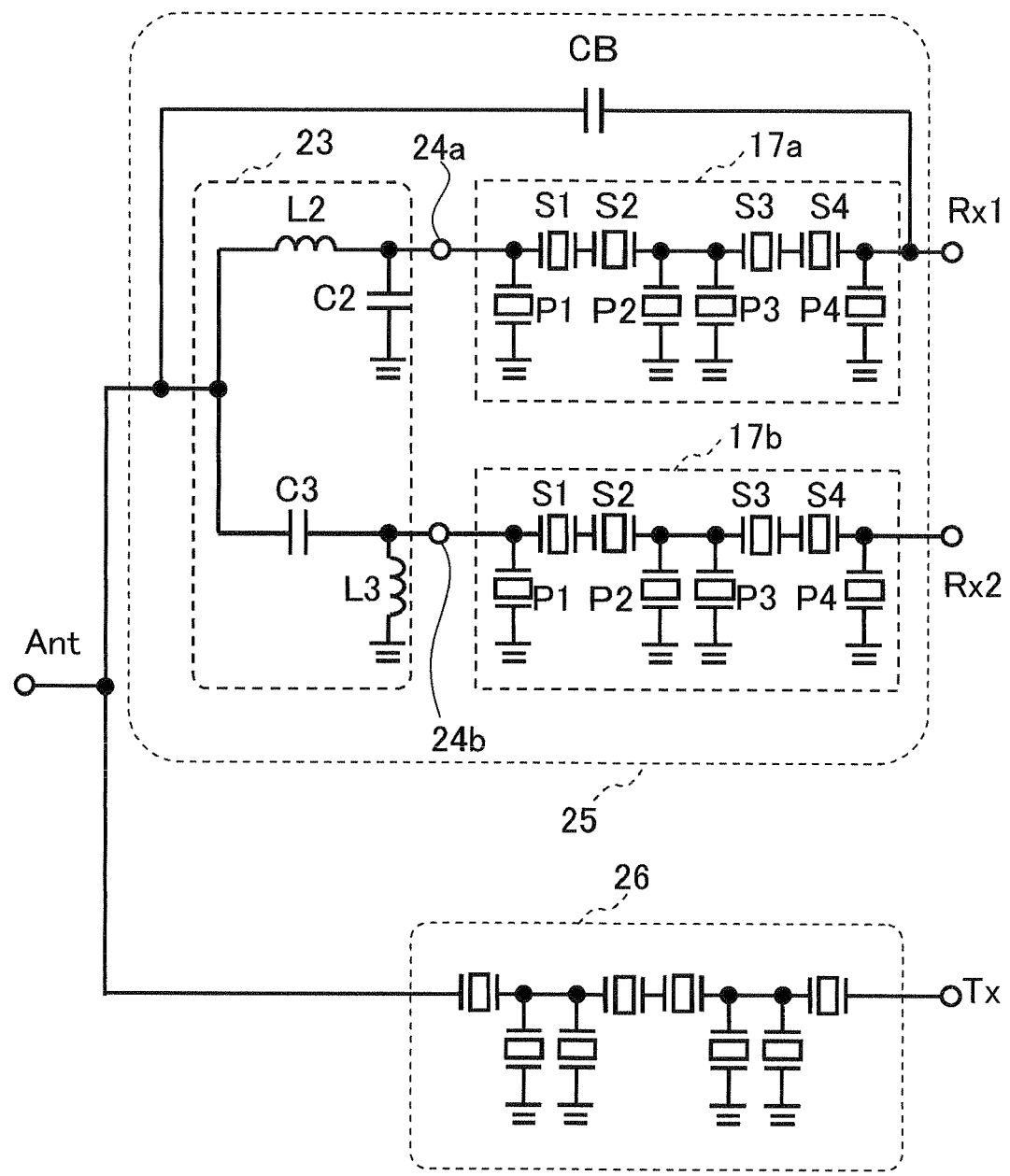
FIG. 16 a view illustrating a duplexer including the balanced filter illustrated in FIG. 12.

FIG. 16 is a view illustrating a duplexer including the balanced filter illustrated in FIG. 12. In the duplexer, a receiving filter 25 and a transmitting filter 26 are coupled to an antenna terminal Ant. The output side terminals of the receiving filter 25 are receiving terminals Rx1 and Rx2; and the input terminal of the transmitting filter 26 is a transmitting terminal Tx. That is, in the duplexer, the balanced filter illustrated in FIG. 12 is used as the receiving filter (Rx filter) 25. Thus, the receiving terminals Rx1 and Rx2 are balanced output terminals. The transmitting filter 26 is a ladder filter.

Figure 17A:
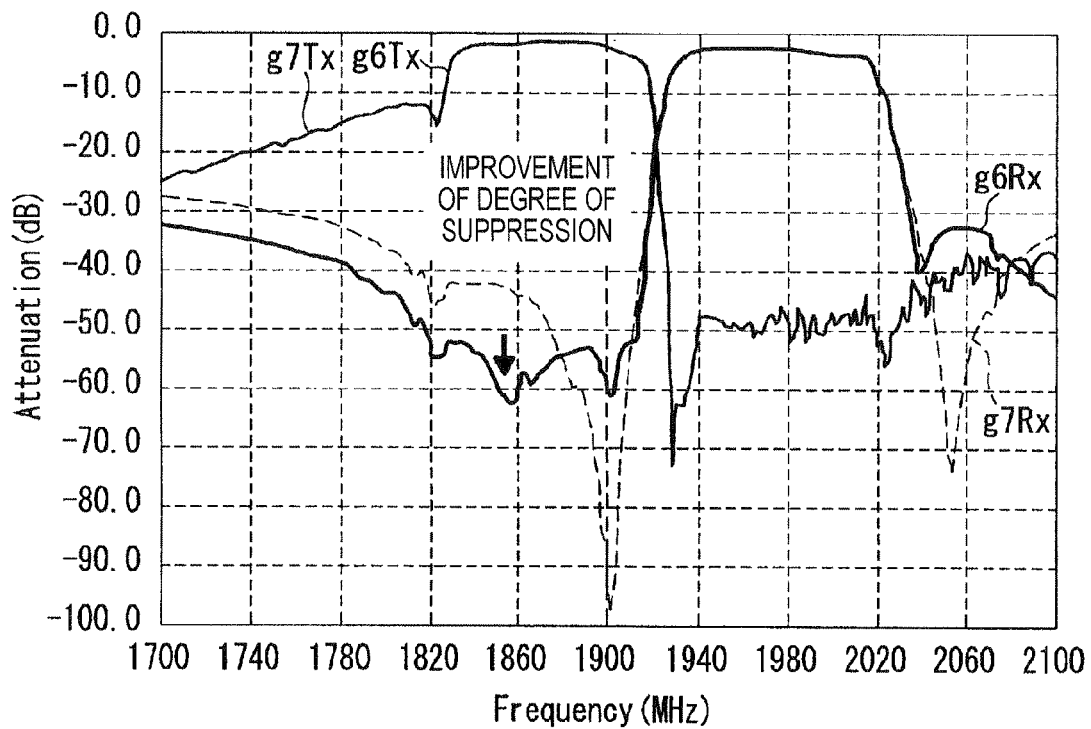
FIG. 17A is a graph illustrating a result of calculating the characteristic of the balanced duplexer illustrated in FIG. 16.

FIG. 17A is a graph illustrating a result of calculating the characteristic (after the balanced combination) of the balanced duplexer illustrated in FIG. 16. In the graph, the solid line g6Rx indicates the characteristic of the receiving filter 25 and the solid line g6Tx indicates the characteristic of the transmitting filter 26. The broken lines g7Rx and g7Tx indicate the characteristic of the receiving filter and the transmitting filter in the balanced duplexer using as the receiving filter the balanced filter illustrated in FIG. 1A to which the bridging capacitor CB is not added (the solid line g6Tx is substantially identical to the broken line g7Tx). From FIG. 17A, it may be seen that when the bridging capacitor CB is added, an output signal is offset at one of the receiving terminals Rx, so that the degree of suppression is improved in the frequency band on the low frequency side of the pass band of the receiving filter.

Figure 17B:
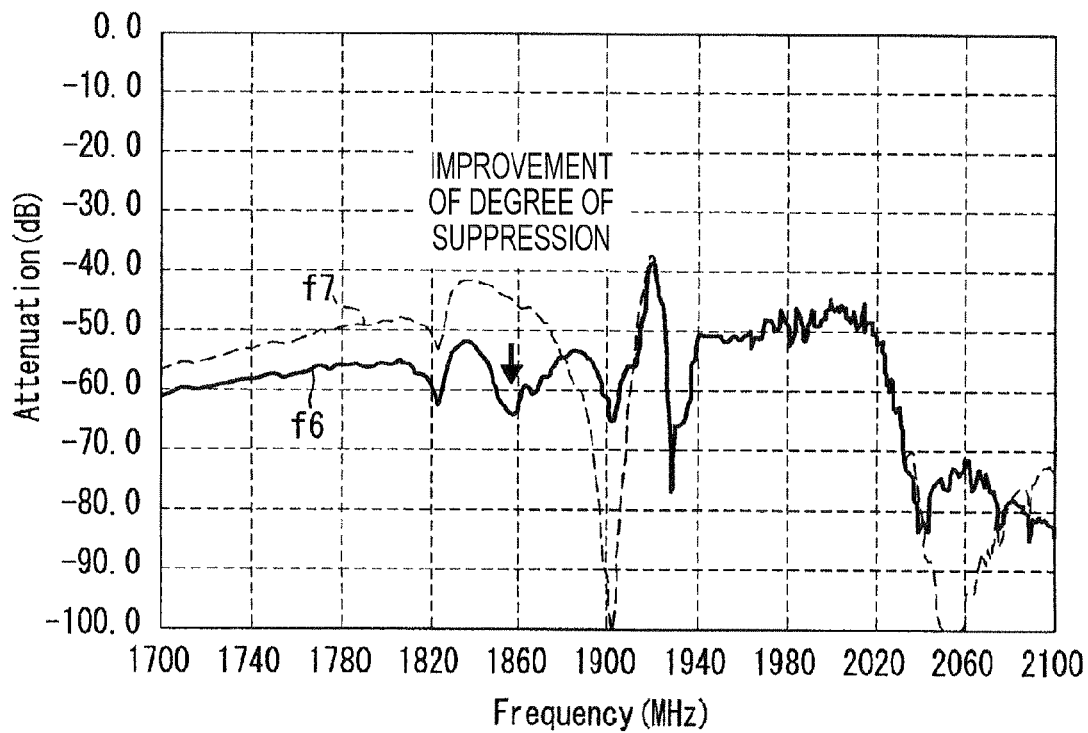
FIG. 17B is a graph illustrating the isolation characteristic of the balanced duplexer illustrated in FIG. 16.

FIG. 17B is a graph illustrating an isolation characteristic (the solid line f6) between the transmitting terminal Tx and the receiving terminal Rx of the balanced duplexer illustrated in FIG. 16. Here, the broken line f7 indicates the isolation characteristic of the balanced duplexer using the balanced filter illustrated in FIG. 11A to which the bridging capacitor CB is not added. From FIG. 17B, it may be seen that the isolation characteristic between the transmitting terminal Tx and the receiving terminal Rx is also significantly improved reflecting the suppression characteristic of the receiving filter 25. A similar effect is also achieved using a duplexer with the filter according to another embodiment.

The duplexer illustrated in FIG. 16 may include, as described later, a balun chip, a receiving filter chip, and a transmitting filter chip mounted on a substrate. In this case, when the balun chip, the receiving filter chip, and the transmitting filter chip are sealed into a ceramic package, downsizing and high reliability may be achieved.

When the functional parts such as filter chips and balun chips are mounted in a package, transmission lines (wiring pattern) between the chips, and transmission lines (wiring pattern) coupling the terminals of the chips with the input and output terminals of the package are formed. The wiring pattern may act as inductance. That is, due to the wiring pattern, inductance may be inserted between the functional parts and between the functional parts and the terminals.

Figure 18:
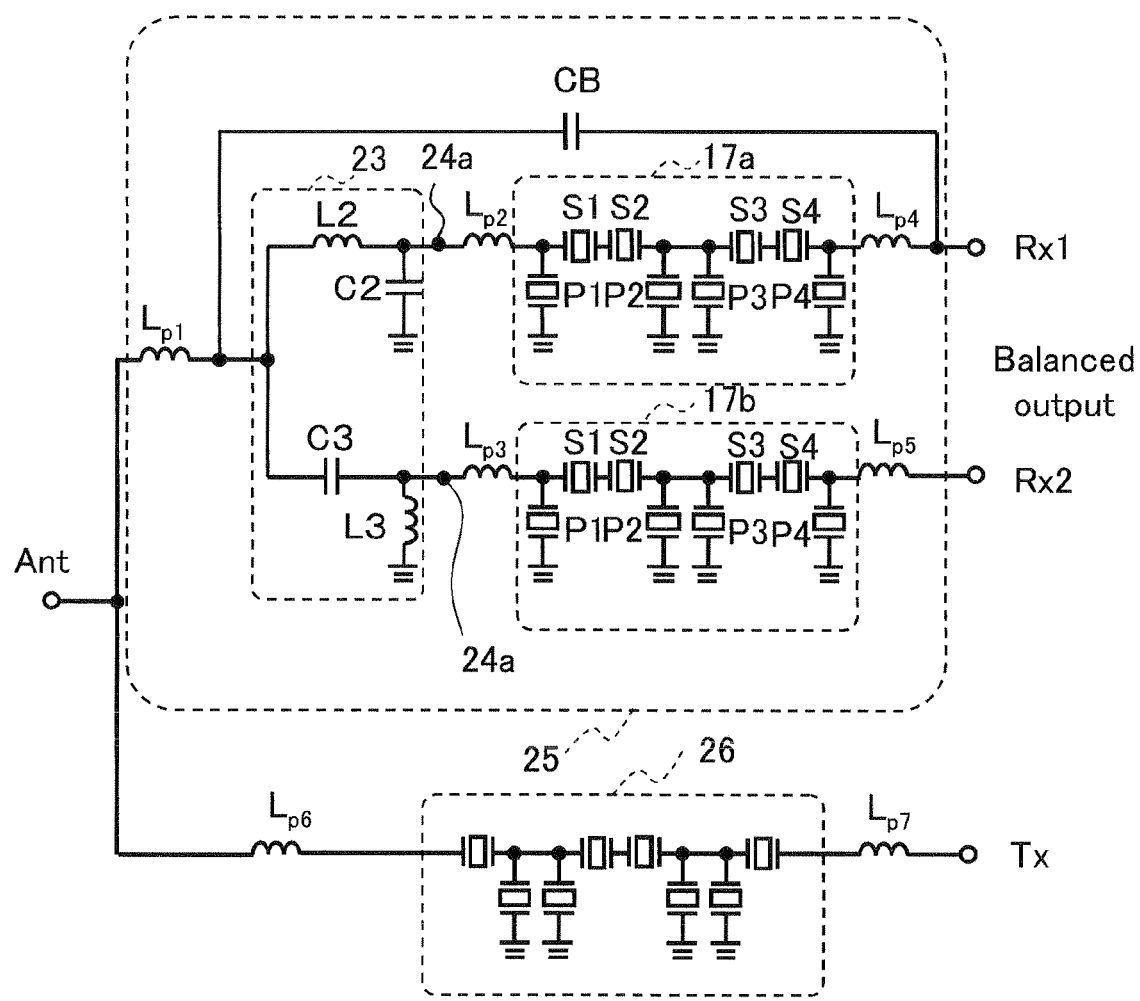
FIG. 18 is a view illustrating an equivalent circuit including inductance inserted when the duplexer of FIG. 16 is formed.

FIG. 18 is an equivalent circuit diagram where inductance inserted when the duplexer of FIG. 16 is mounted in a package is also considered. Inductance $L_{p1}$ is inserted between the antenna terminal Ant and the balun 23; inductance $L_{p2}$, between the balun 23 and the filter unit 17a; inductance $L_{p3}$, between the filter unit 17a and the receiving terminal Rx1; inductance $L_{p4}$, between the balun 23 and the filter unit 17b; inductance $L_{p5}$, between the filter unit 17a and the receiving terminal Rx2.

In this way, the wiring pattern formed in the package is typically designed so as to produce a shortest path. Thus the inductance inserted by the wiring pattern is typically 0.2 nH to 0.6 nH, which is small. Accordingly, when the electrical resistance of wiring materials is sufficiently small, the inductance may not have much effect on the characteristic.

Figure 19:
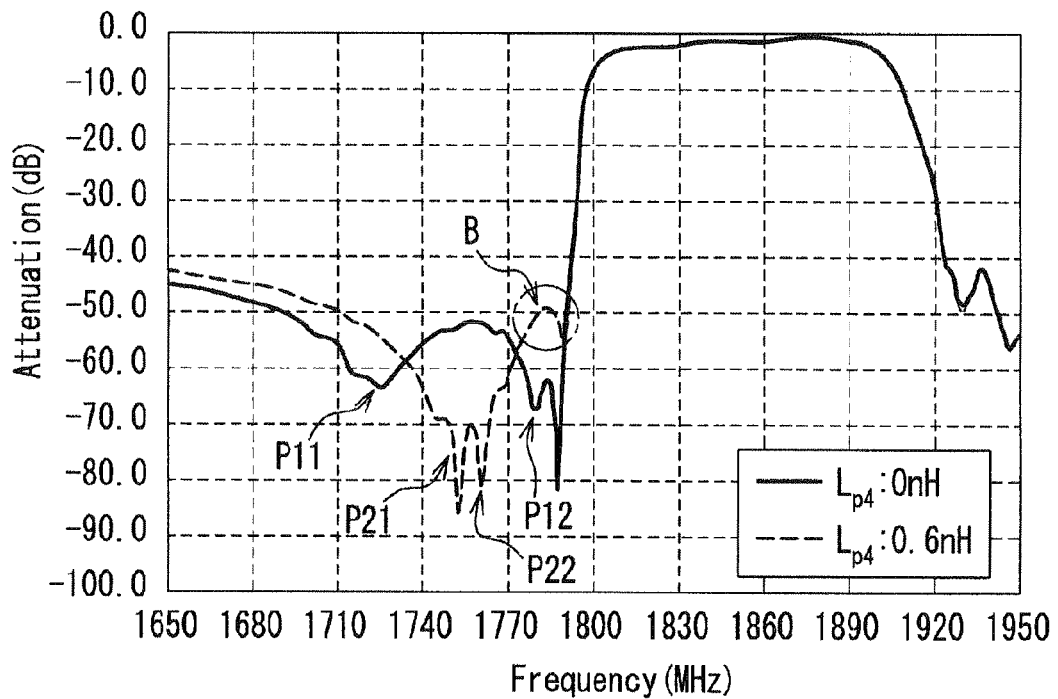
FIG. 19 is a graph illustrating a result of calculating effects of $L_{p4}$ on receiving filter characteristics.

However, when the bridging capacitor CB is, as illustrated in FIG. 18, inserted between the receiving terminal RX1 of the side where pass phase is delayed in the filter unit and the antenna terminal Ant in a manner extending across the filter unit 17a and the balun 23, then effects of inductance are considered. When the bridging capacitor CB is added, inductance $L_{p4}$ coupled to the receiving terminal Rx1 may have a large effect on the suppression characteristic of the filter. FIG. 19 is a graph illustrating a result of calculating the effects of $L_{p4}$ on receiving filter characteristics by use of a circuit simulator.

When inductance $L_{p4}$=0 nH, poles p11 and p12 are produced in the frequency characteristic, but when inductance $L_{p4}$ is varied to 0.6 nH, the poles shifts to p21 and p22, and a bunchy peak B is produced in the vicinity of the pass band. The peak B causes degradation of suppression of the receiving filter and degradation of the isolation characteristic in the duplexer.

According to the present embodiment, in order to suppress $L_{p4}$ which causes characteristic degradation, inductance $L_{p3}$ of the output terminal 24a of the side where the pass phase is advanced in the balun 23 is inductively coupled to $L_{p4}$. By way of example of the approach of inductively coupling $L_{p3}$ to $L_{p4}$, a wiring pattern in a package in which the duplexer is mounted is designed so that the line between the balun 23 and the filter unit 17b is inductively coupled to the line between the filter unit 17a and the receiving terminal Rx1.

Figure 20:
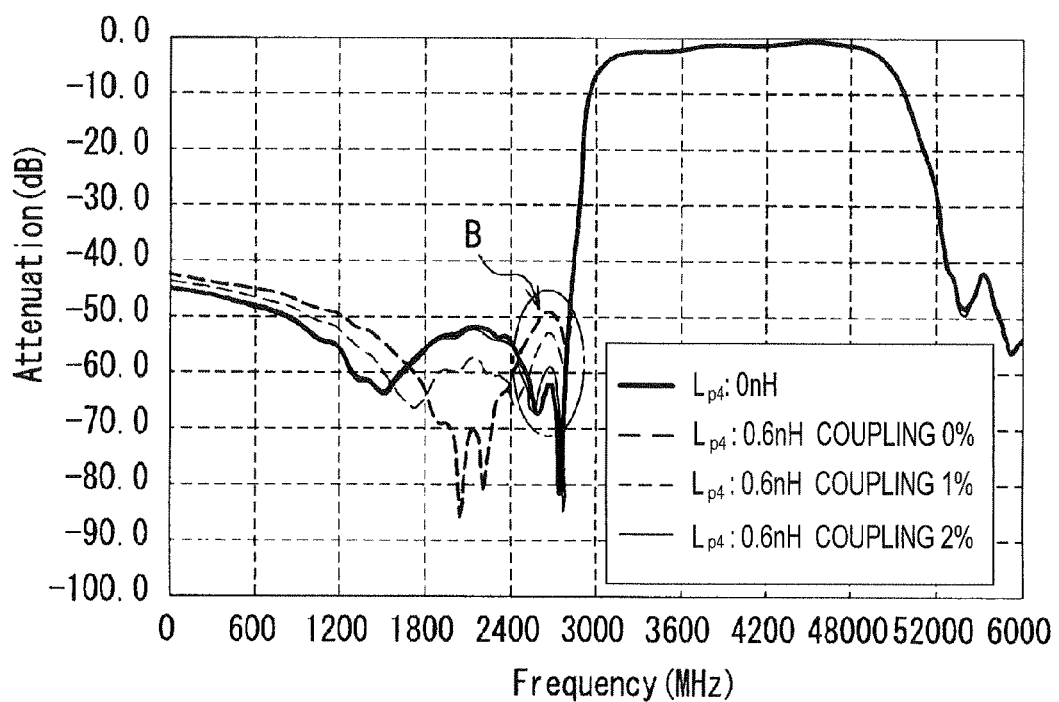
FIG. 20 is a graph illustrating effects of inductive coupling of $L_{p3}$ and $L_{p4}$.

FIG. 20 is a graph illustrating the effects of inductive coupling of $L_{p3}$ and $L_{p4}$. As the coupling coefficient increases, the effects of $L_{p4}$ are reduced and the bunched peak B in the frequency characteristic also becomes smaller. In a case where $L_{p2}$ and $L_{p5}$ are inductively coupled, also, the suppression characteristic may be similarly improved.

Figure 21:
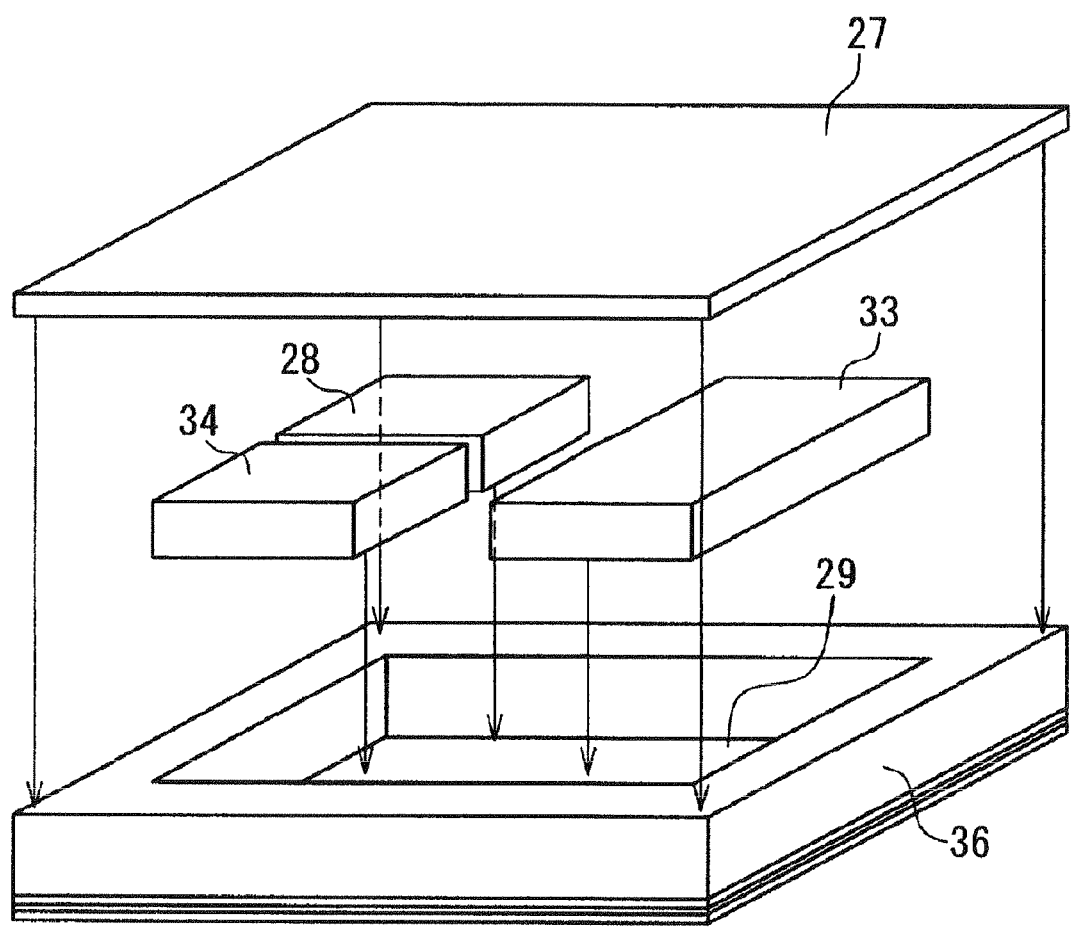
FIG. 21 is a view illustrating an implementation of the balanced duplexer illustrated in FIG. 18.

FIG. 21 is a view illustrating an implementation of the balanced output duplexer illustrated in FIG. 18. In the example illustrated in FIG. 21, a balun chip 28, a transmitting filter chip 33, and a receiving filter chip 34 are flip-chip mounted in a ceramic package 36 with a cavity 29. The balun chip 28 is an IPD chip in which the balun 23 in FIG. 18 is formed. The transmitting filter chip 33 is a chip in which the transmitting filter 26 is formed, and the receiving filter chip 34 is a chip in which the filter units 17a and 17b are formed. Conduction between these chips and the ceramic package 36 may be made by an Au bump, for example. A metal lid 27 is arranged as a cap on the ceramic package 36 with the chips mounted therein, whereby the cavity 29 is hermetically sealed.

The ceramic package 36 is, for example, a multilayer package including a die-attach layer on which a chip is mounted and an intermediate layer below the die-attach layer. In this case, a foot pad is arranged in the rear side of the intermediate layer, whereby a foot pad layer is formed. The bridging capacitor CB coupling the antenna terminal Ant and the receiving terminal Rx1 in a bridging manner is, as described later, formed in the ceramic package 36, for example.

Figure 22:
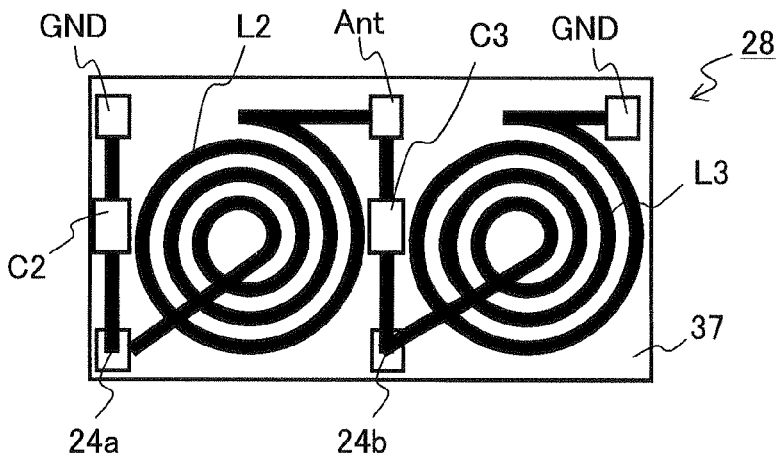
FIG. 22 is a plan view of a balun chip.

FIG. 22 is a plan view of the balun chip 28. In the example illustrated in FIG. 22, a coil L2 is formed between an antenna terminal Ant and an output terminal 24a on a silica substrate 37, and a coil L3 is formed between an output terminal 24b and a GND terminal. The coils L2 and L3 are each formed, for example, of a spiral coil using a film of metal such as copper. Further, a capacitor C3 is formed between the antenna terminal Ant and the output terminal 24b, and a capacitor C2 is formed between the output terminal 24a and the GND terminal. The capacitors C2 and C3 are each formed of a metal-insulation-metal (MIM) capacitor, for example.

Figure 23:
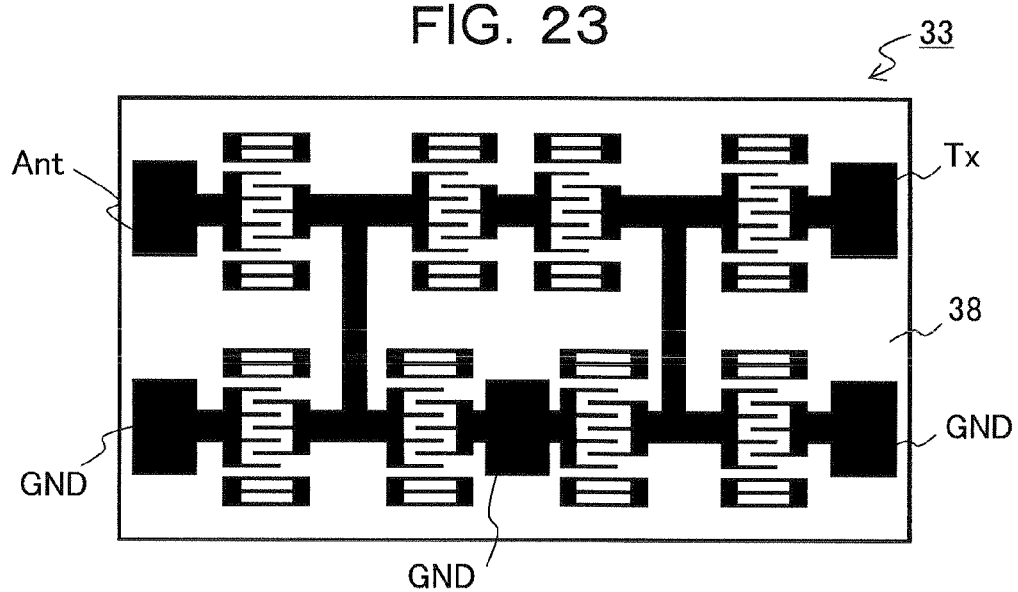
FIG. 23 is a plan view of a transmitting filter chip.

FIG. 23 is a plan view of the transmitting filter chip 33. In the example illustrated in FIG. 23, series resonators and parallel resonators of the ladder filter are each formed by a surface acoustic wave device arranged on a piezoelectric substrate 38. The surface acoustic wave device is coupled via a line pattern to the antenna terminal Ant, the transmitting terminal Tx or the ground terminal GND.

Figure 24:
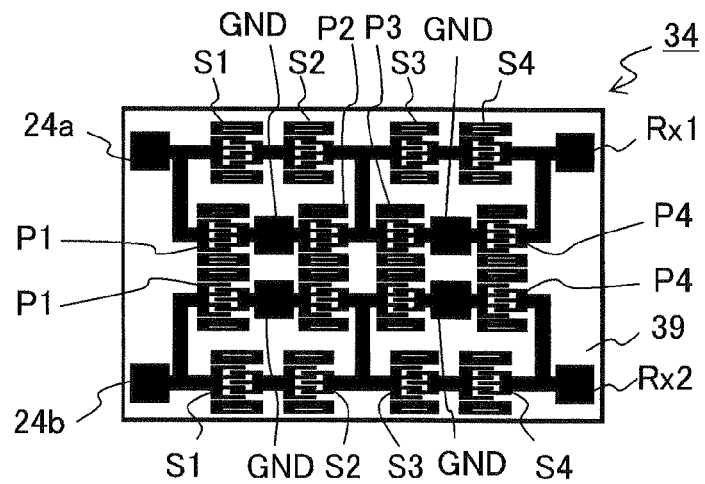
FIG. 24 is a plan view of a receiving filter chip.

FIG. 24 is a plan view of the receiving filter chip 34. In the example illustrated in FIG. 24, series resonators S1 to S4 and parallel resonators P1 to P4 of the ladder filter are each formed by a surface acoustic wave device arranged on a piezoelectric substrate 39. The surface acoustic wave device is coupled via a line pattern to the output terminals 24a and 24b, the receiving terminals Rx1 and Rx2, and the ground terminal GND.

Figure 25:
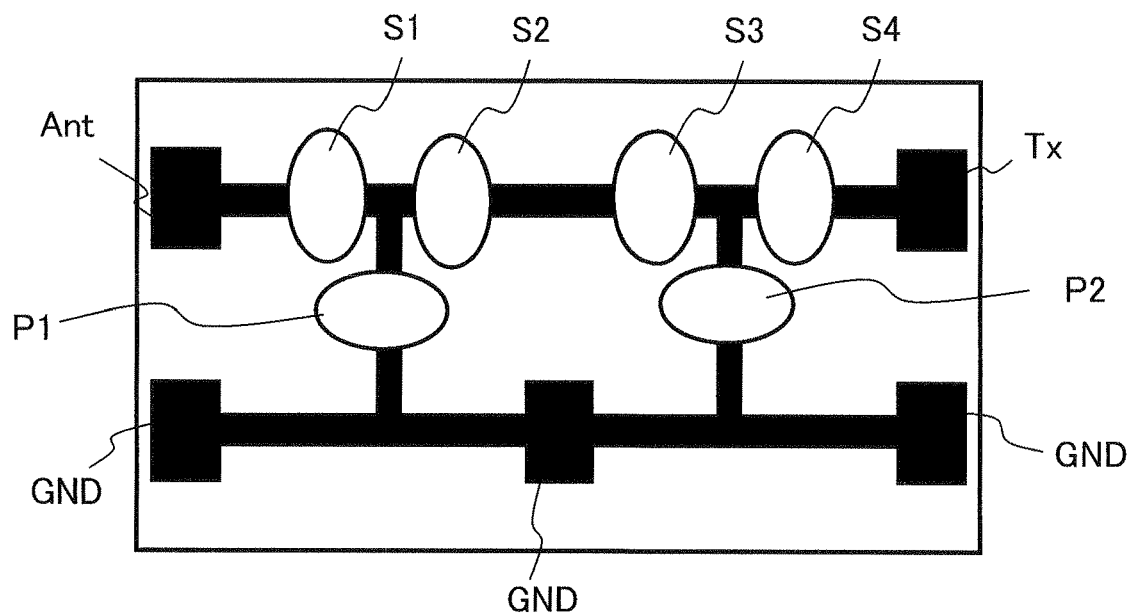
FIG. 25 is a plan view of a transmitting filter chip 33 using FBAR.
Figure 26:
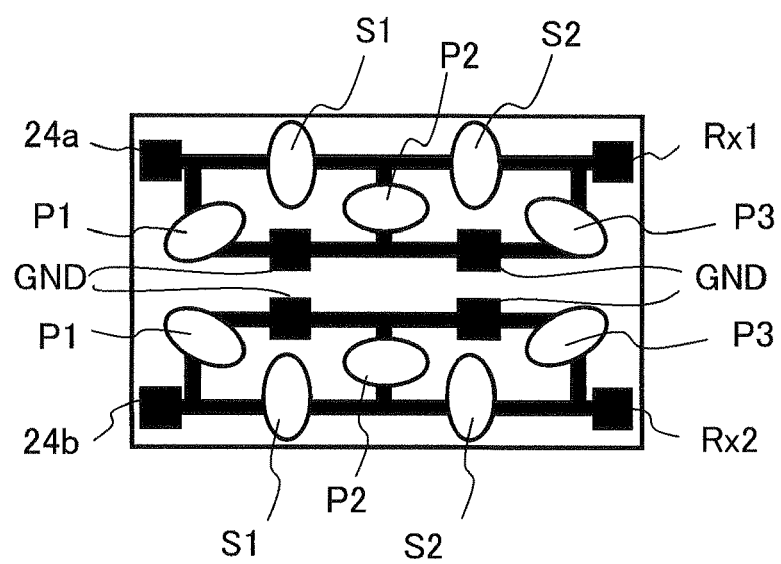
FIG. 26 is a plan view of a receiving filter chip 34 using FBAR.

In the transmitting filter chip 33 illustrated in FIG. 23 and the receiving filter chip 34 illustrated in FIG. 24, the resonators of the ladder filter may be formed by a film bulk acoustic resonator (FBAR), a boundary acoustic wave device, or the like. FIG. 25 is a plan view of a transmitting filter chip 33 using the FBAR. FIG. 26 is a plan view of a receiving filter chip 34 using the FBAR. Referring to FIG. 25, series resonators S1 to S4 and parallel resonators P1 and P2 making up the ladder filter are each formed by an FBAR. Referring to FIG. 26, series resonators S1 and S2 and parallel resonators P1 to P3 making up the ladder filter are each formed by an FBAR.

Reference characters applied to each part illustrated in FIGS. 22 to 28 correspond to those applied to each part illustrated in FIGS. 16 and 18.

An example in which the bridging capacitor CB is formed in the ceramic package 36 will be described.

Figure 27A:
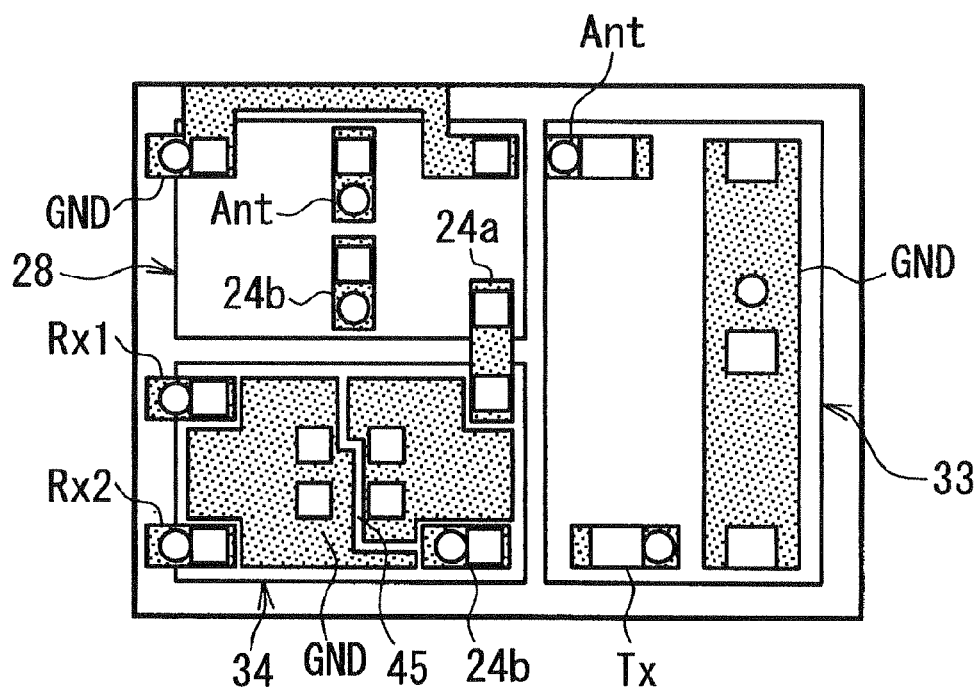
FIG. 27A is a view illustrating a wiring layout on the surface of a die-attach layer.
Figure 27B:
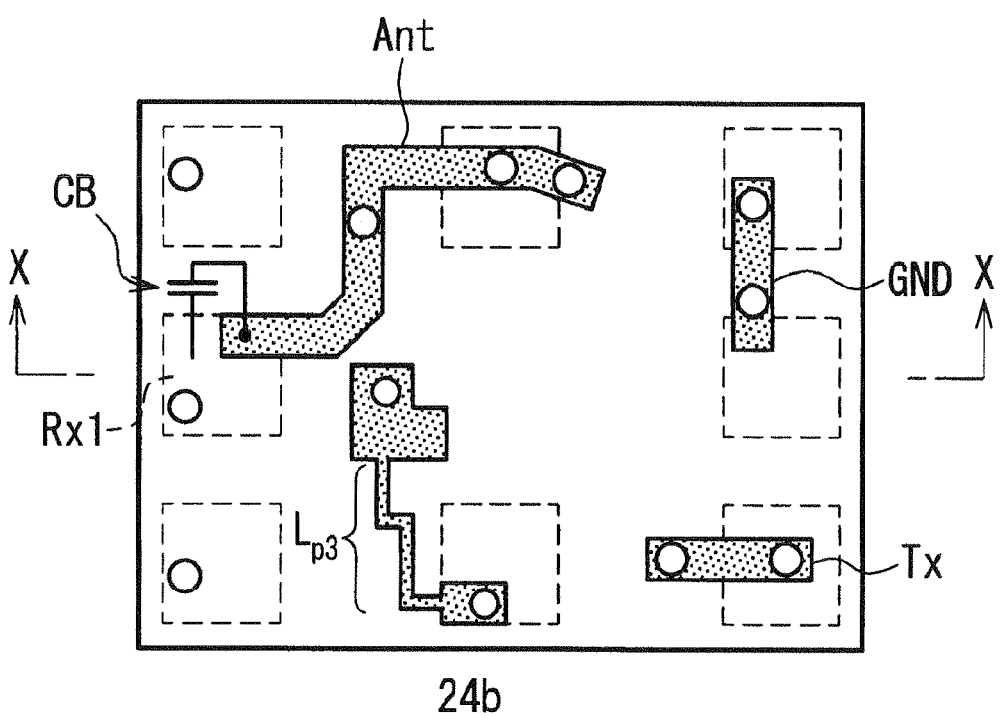
FIG. 27B is a view illustrating a wiring layout of an intermediate layer.
Figure 27C:
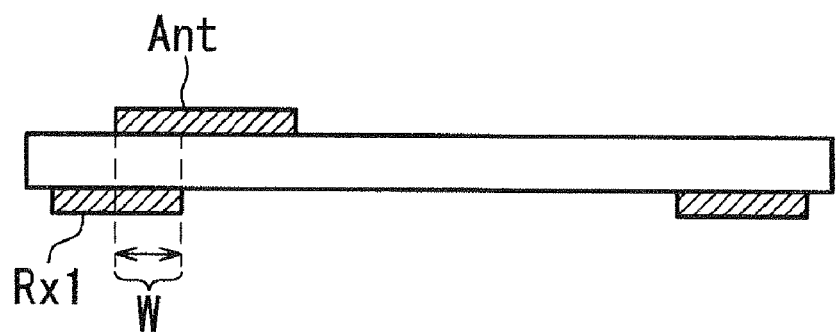
FIG. 27C is a cross-sectional view of the intermediate layer of FIG. 27B along the line X-X.
Figure 27D:
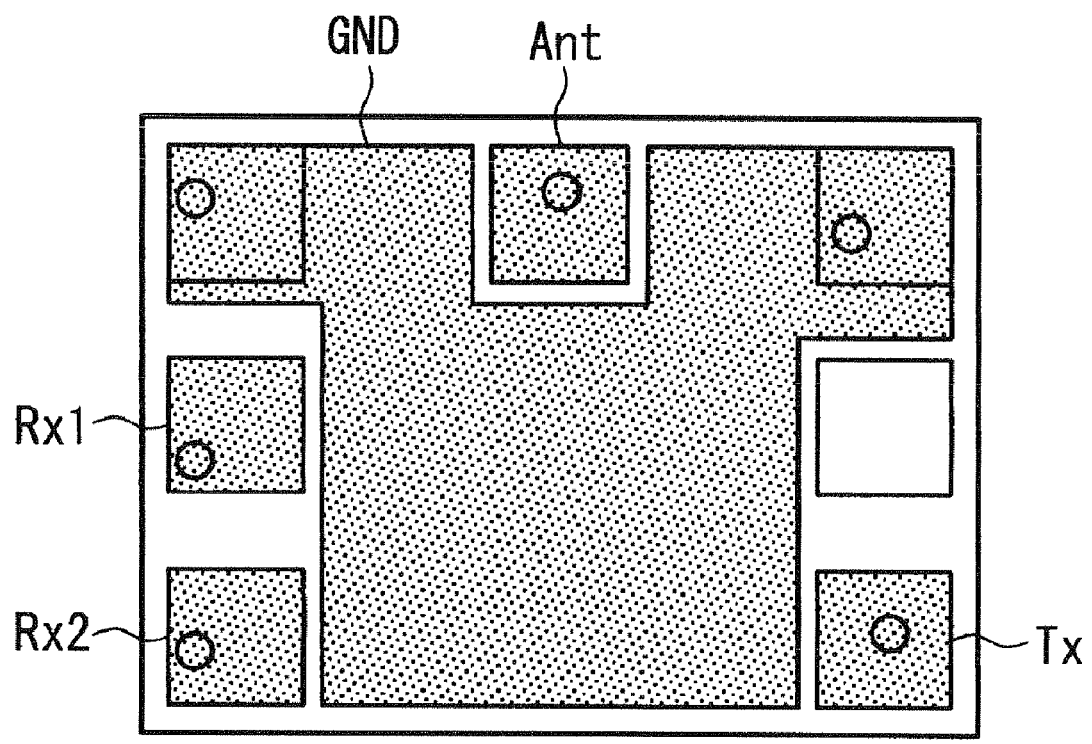
FIG. 27D is a view illustrating an arrangement of a foot pad in a foot pad layer.

FIG. 27A is a view illustrating a wiring layout on the surface of a die-attach layer of the ceramic package 36. FIG. 27B is an example of a wiring layout on a surface of an intermediate layer being a layer below the die-attach layer. FIG. 27C is a cross-sectional view of the intermediate layer of FIG. 27B along the line X-X. FIG. 27D is a view illustrating an arrangement of foot pads in a foot pad layer being a layer below the die-attach layer.

The rectangles in FIG. 27A indicate pads to which bumps for coupling the chips with the ceramic package 36 are bonded. The circles in FIGS. 27A to 27D indicate vias for making conduction with another layer. The hatching in FIGS. 27A to 27D indicates a conductor, and principally a line pattern. The line pattern performs bump to bump connections, via to via connections, bump to via connections, or via to bump connections. The reference characters applied to line patterns in FIGS. 27A to 27D are ones applied to respective terminals to which those line patterns are coupled. The reference characters applied to each terminal correspond to the terminals illustrated in FIG. 18. In FIGS. 27A to 27D, only layouts of lines and terminals related to the bridging capacitor CB and the inductances $L_{p3}$ and $L_{p4}$ are illustrated, and the other layouts are omitted.

For example, in the die-attach layer illustrated in FIG. 27A, the antenna terminal Ant of the balun chip 28 is coupled through a line pattern to a via, and the antenna terminal Ant of the transmitting filter chip 33 is also coupled through a line pattern to a via. These vias are in conduction to the intermediate layer illustrated in FIG. 27B, and are coupled to each other through a line pattern Ant (line pattern coupled to the Ant terminal) in the intermediate layer. In the example illustrated in FIG. 27B, the broken lines indicate foot pads arranged on the rear side of the intermediate layer.

One end of the line pattern Ant coupled to the Ant terminal in the intermediate layer is disposed above a foot pad of the receiving terminal Rx1. In this way, the line pattern Ant (wiring) coupled to the antenna terminal Ant extends to immediately above the foot pad of the receiving terminal Rx1, whereby this line pattern and the foot pad of the receiving terminal Rx1 form a parallel plate capacitor having ceramic as a dielectric layer. FIG. 27C is a cross-sectional view of the capacitor. Accordingly, when the overlap part W of the line pattern and the foot pad is adjusted, a desired capacitance value is provided. Thus, the attenuation pole frequency may be freely controlled by the line pattern Ant.

In this way, the bridging capacitor CB is constructed using a simple configuration. Thus, a desired filter suppression characteristic may be readily implemented without causing a problem such as package size growth and interference caused by a complex wiring structure.

A case will be described in which the inductances $L_{p3}$ and $L_{p4}$ are inductively coupled in the ceramic package 36.

Figure 28:
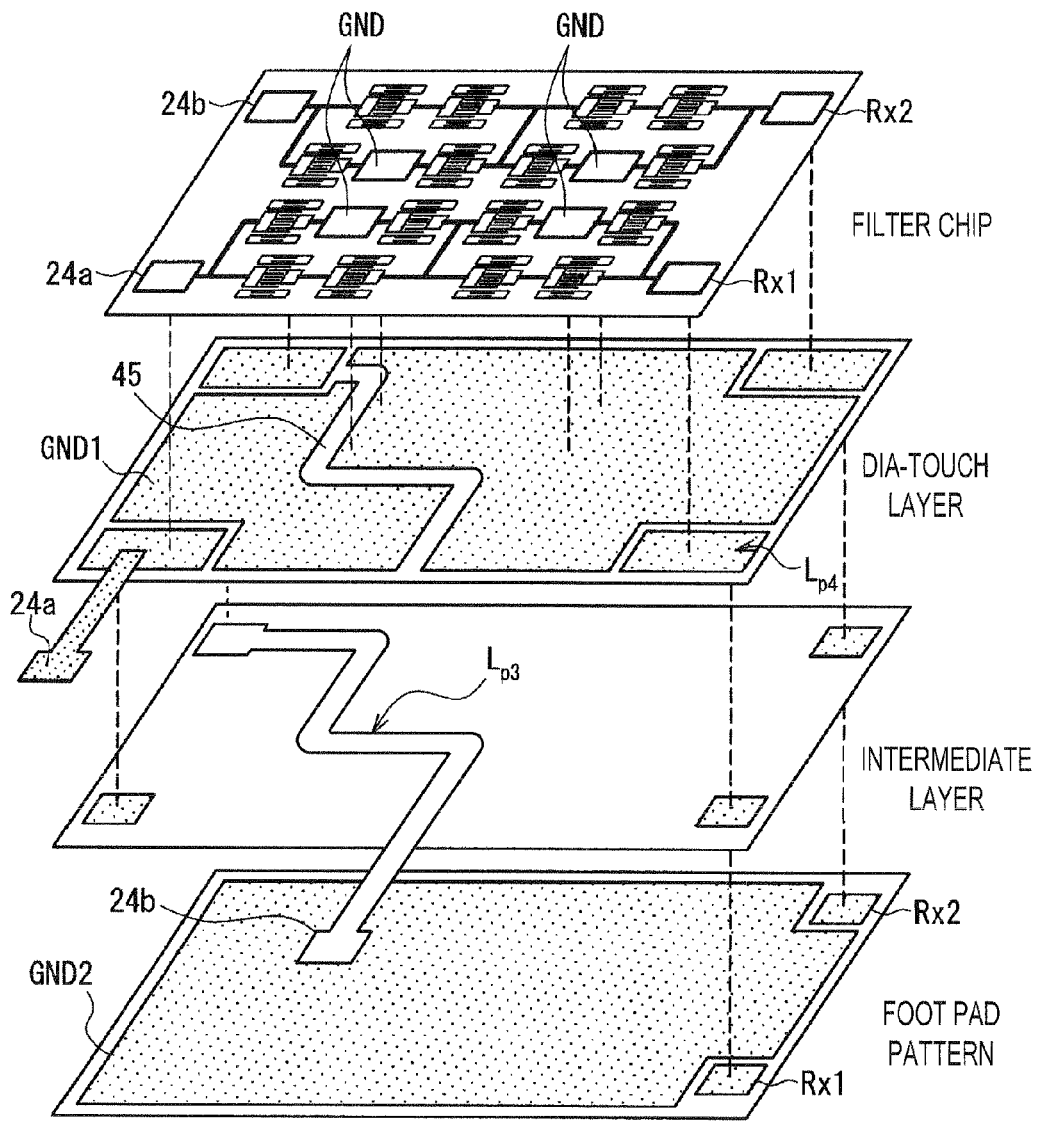
FIG. 28 is a view illustrating a wiring pattern of a receiving filter chip and a ceramic package.

FIG. 28 is a conceptual diagram illustrating a wiring pattern of the receiving filter chip 34 and the ceramic package. FIG. 28 is a schematic perspective view of metal patterns of a filter chip, a die-attach layer, an intermediate layer, and a foot pad layer on the rear side of the intermediate layer. Electrical conduction between each layer is indicated by a vertical line, but lines used for description are illustrated and the other through lines are omitted.

In the die-attach layer immediately below the receiving filter chip 34, a metal pattern (ground pattern GND1) coupled to the ground is, as illustrated in FIG. 28, disposed over most of the area excluding bump pads of terminals 24a, 24b, Rx1 and Rx2. The die-attach layer has the output terminal 24a. The intermediate layer includes a signal line (signal line coupled to the output terminal 24b) coupling the receiving filter chip 34 and the balun chip 28. This signal line has the inductance $L_{p3}$. In the die-attach layer, the ground metal pattern is removed in a region which overlaps this signal line in a stacking direction when the signal line passes through the intermediate layer immediately below the die-attach layer. That is, the ground metal pattern is not arranged immediately above the signal line. The inductance $L_{p3}$ and the inductance $L_{p4}$ produced in a line extending from the receiving terminal Rx1 of the receiving filter chip 34 to the receiving terminal Rx1 of the foot pad are electromagnetically coupled.

The inductance $L_{p3}$ in the equivalent circuit of FIG. 18 corresponds to the inductance of the line extending from the output terminal 24b (coupled through the intermediate layer) of the balun chip 28 to the output terminal 24b on the receiving filter chip 34 in FIG. 28. The inductance $L_{p4}$ in the equivalent circuit of FIG. 18 corresponds to the inductance of the line extending from the receiving terminal Rx1 on the receiving filter chip 34 to the receiving terminal Rx1 of the foot pad in FIG. 28.

The inductive coupling will be described below. In a typical duplexer, the pass band of a receiving filter is in a higher frequency side relative to the pass band of a transmitting filter, and the receiving filter s preferably very steep in the lower frequency side of the pass band. In order to implement the steepness in the lower frequency side of the pass band, the resistance and inductance between the ground pad on the filter chip and the ground pad on the surface of the package foot pad are preferably sufficiently small.

Referring to FIG. 28, the ground pattern GND1 on the surface of the die-attach layer and the ground GND2 of the foot pad on the rear surface each have a sufficiently large area, and these are tightly coupled through multiple through lines. In FIG. 28, however, the through lines coupling GND1 and GND2 are omitted.

Figure 29:
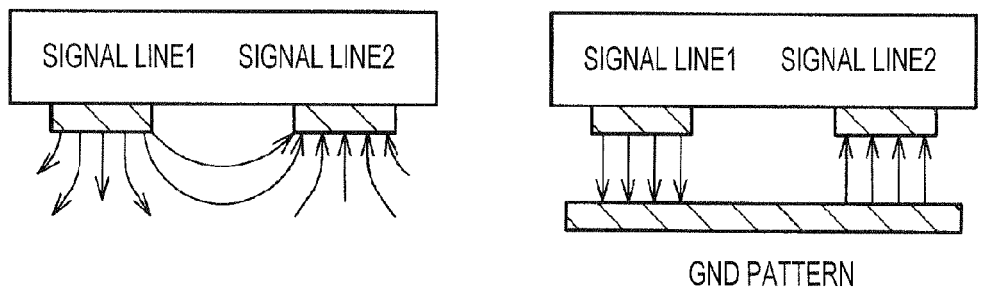
FIG. 29 is a view illustrating electric flux lines when a GND pattern is arranged immediately below signal lines, and when not arranged.

In FIG. 28, as described above, the ground pattern is arranged in most of the area excluding the bump pads in the die-attach layer immediately below the receiving filter chip 34. This arrangement is for suppressing inductive coupling between lines on the receiving filter chip 34. FIG. 29 is a view for describing inductive coupling suppression. FIG. 29 is a view illustrating electric flux lines when the ground metal pattern (GND pattern) is arranged immediately below signal lines and when not arranged. When the GND pattern is arranged immediately below the signal line, electric flux lines are concentrated between the signal line and the ground. Thus, the distribution of electric flux lines is not widespread and thus electromagnetic coupling (inductive coupling) with other signal lines seldom occurs, so that interference between neighboring signal lines is suppressed.

As illustrated in FIG. 28, when the GND pattern is removed in a region which overlaps (in a stacking direction) the signal line on the layer immediately above (or below) the signal line coupling the balun chip 28 and the receiving filter chip 34, electric flux lines of the signal line become widespread. As a result, this signal line readily couples inductively to the line extending from the receiving terminal Rx1 of the receiving filter chip 34 to the receiving terminal Rx1 of the foot pad. The GND pattern may be removed in the whole region which overlaps the signal line, or may be removed in a part of the region which overlaps the signal line. The degree of inductive coupling is controlled by the extent of removal or shape of the GND pattern. In this way, when package layout is made in view of inductive coupling, the suppression characteristic of the filter may be improved without arranging additional parts.

In the example illustrated in FIG. 28, an opening 45 is arranged in the ground pattern GND1 on the die-attach plane, and the shape of the opening 45 is similar to that of the line extending from the output terminal 24b in the intermediate layer to the output terminal 24b on the receiving filter chip 34.

Figure 30:
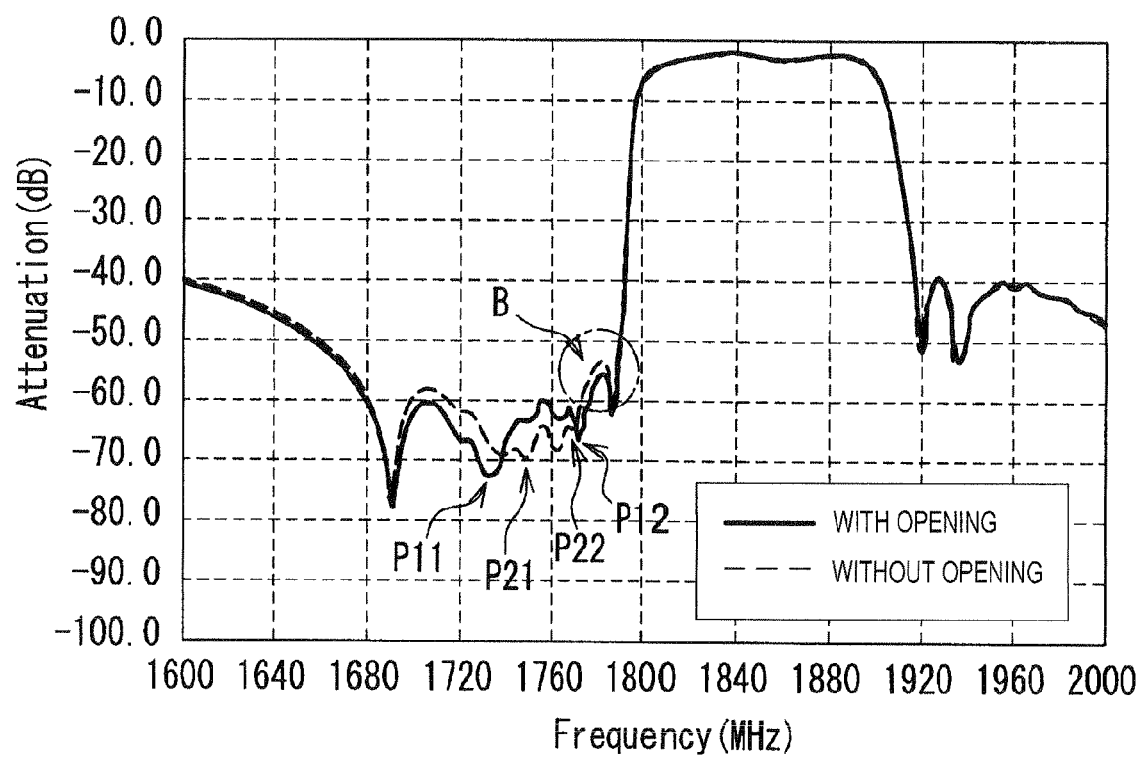
FIG. 30 is a graph illustrating a result of calculating the frequency characteristic of the receiving filter when an opening is arranged and when not arranged.

FIG. 30 illustrates a result of calculating, using the finite element method, the frequency characteristic of the receiving filter 25 when the opening 45 is arranged and when not arranged. The attenuation poles p21 and p22 produced when the opening 45 is not arranged shift to attenuation poles p11 and p12, respectively, and when the opening 45 is arranged, the bunched peak B is suppressed.

The width of the opening 45 in the GND pattern will be described now. As described above, in preventing unwanted inductive coupling in the wiring pattern of the receiving filter chip 34, the ground pattern GND1 immediately below the chip is preferably as wide as possible. Consequently, from this viewpoint, the opening is preferably narrow in width.

In a package using multilayer ceramic, however, the wiring width is designed to have a minimum value by which the yield ratio is ensured in mass production; thus the minimum opening width feasible is equal to the wiring width.

Figure 31:
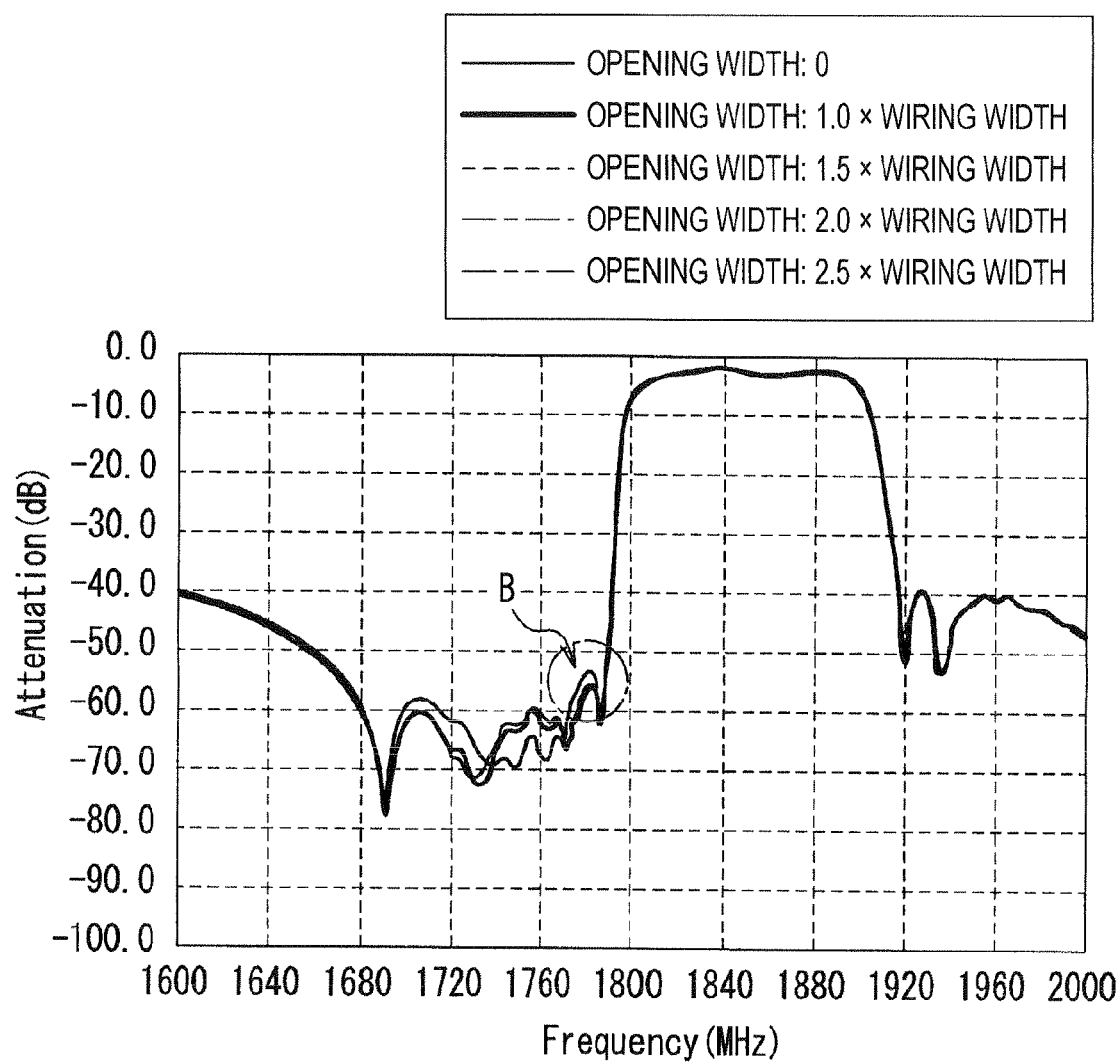
FIG. 31 is a graph illustrating a relationship between the width of the opening and the frequency characteristic of the receiving filter.

FIG. 31 is a graph illustrating a relationship between the width of the opening 45 and the frequency characteristic of the receiving filter 25, the relationship being calculated to check a variation of the characteristic by processing accuracy.

This graph illustrates the characteristic when the width (line width) of the opening 45 of FIG. 28 is varied to 1.0, 1.5, 2.0 or 2.5 times greater than the width of the signal line coupling to the output terminal 24b in the intermediate layer. It may be seen that the bunched peak B is suppressed at any of these opening widths. In FIG. 31, the lines corresponding to the opening widths of 1.5 to 2.5 times greater than the wiring width substantially overlap each other.

Figure 32:
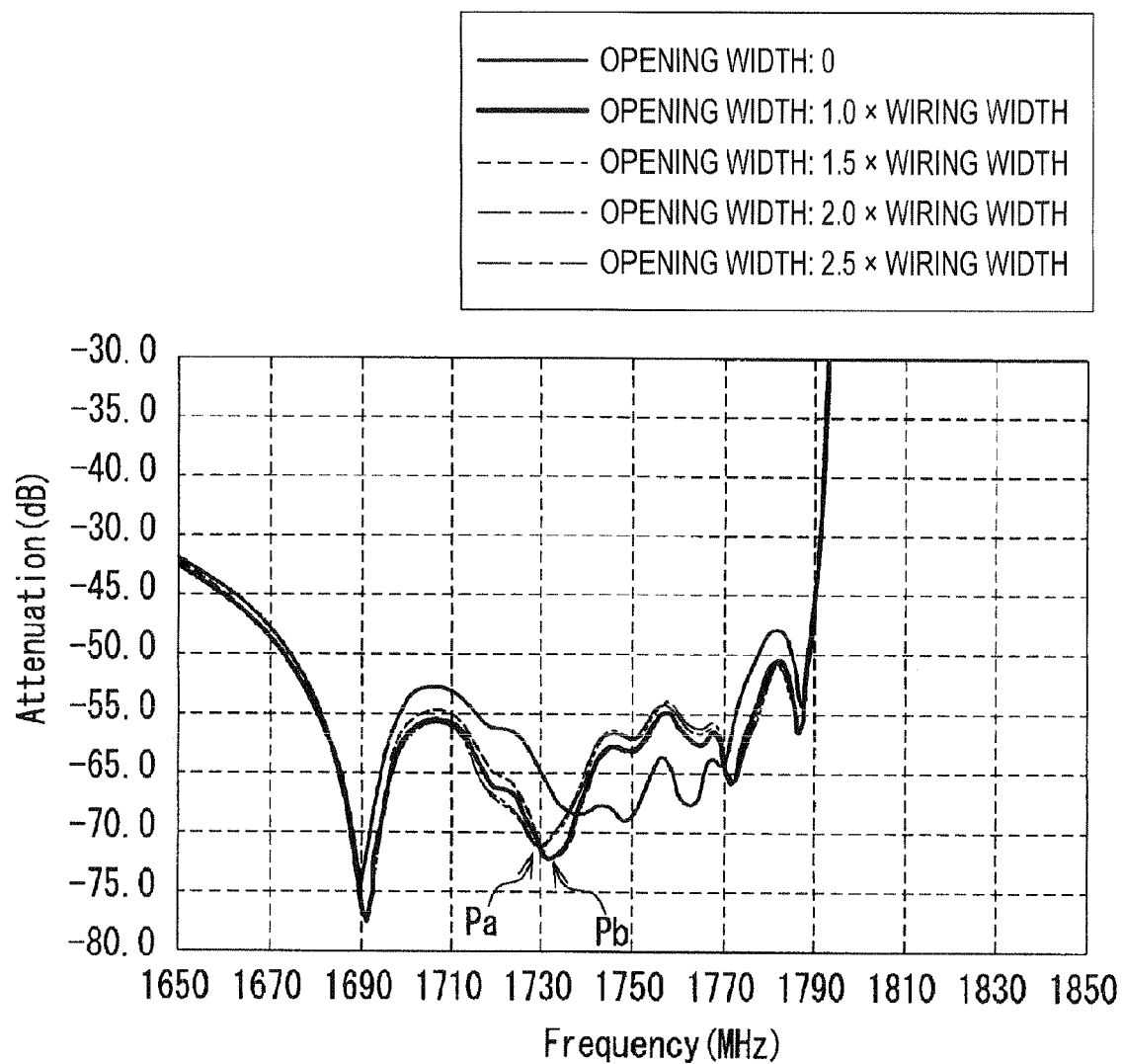
FIG. 32 is a graph obtained by magnifying the characteristic in the vicinity of the pass band in the graph illustrated in FIG. 31.

FIG. 32 is a graph obtained by magnifying the characteristics in the vicinity of the pass band in the graph illustrated in FIG. 31. Referring to FIG. 32, poles Pa and Pb are each an attenuation pole produced by the bridging capacitor CB, but the attenuation pole shifts from Pb to Pa when the opening width is varied to 2.0 times or greater than the wiring width. It is thought that a variation of capacitance between the signal line and the ground causes this shift. Thus, in order to maintain the characteristic, the machining accuracy of the opening width is preferably smaller than twice the wiring width.

The above description is about an example of implementing the coupling between lines in which inductance is inserted, but the method of implementing the coupling is not limited to the above embodiment. For example, lines to be coupled may be disposed close to each other, or another arrangement of a wiring pattern or a GND pattern may be used, whereby the coupling is implemented.

Figure 33:
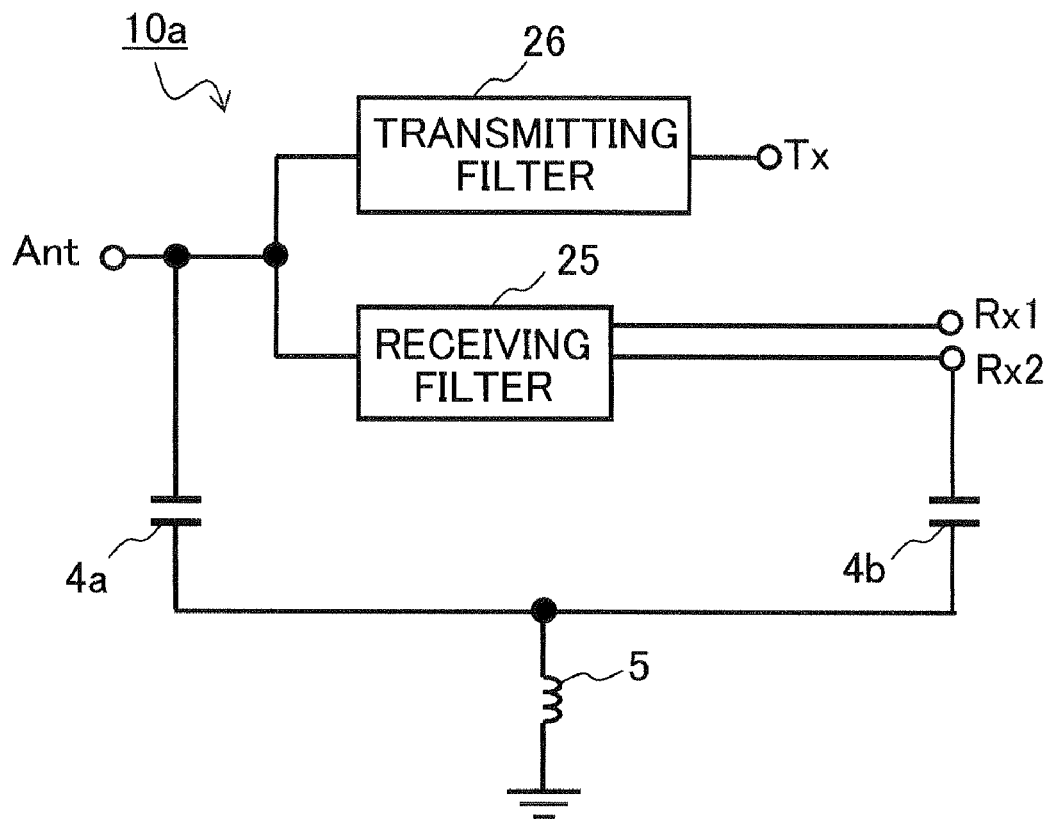
FIG. 33 is a circuit diagram illustrating another example of the bridging capacitor CB.

FIG. 33 is a circuit diagram illustrating a variation of the bridging capacitor CB. In the example of FIG. 33, an antenna terminal Ant and a receiving terminal Rx are coupled by two capacitors 4a and 4b arranged in series on a line coupling the antenna terminal Ant with the receiving terminal Rx2 and by a coil 5 coupled between the line and the ground. As illustrated in FIG. 33, when a reactance substantially equal to that obtained by only the capacitor 4 illustrated in FIG. 1 is implemented by the two capacitors 4a and 4b and the coil 5, capacitance C of the capacitors 4a and 4b is greater than the capacitance of the capacitor 4. As a result, it may be difficult to mount the bridging capacitor CB with the above embodiment; in this case, the capacitor may be divided. When the capacitor is divided, the capacitors 4a and 4b are, as illustrated in FIG. 33, used. In this case, as the capacitors 4a and 4b, capacitors of relatively large capacitance C are used, whereby a reactance substantially equal to that obtained by the single bridging capacitor CB of a capacitance smaller than that of the capacitors 4a and 4b is implemented.

Figure 34:
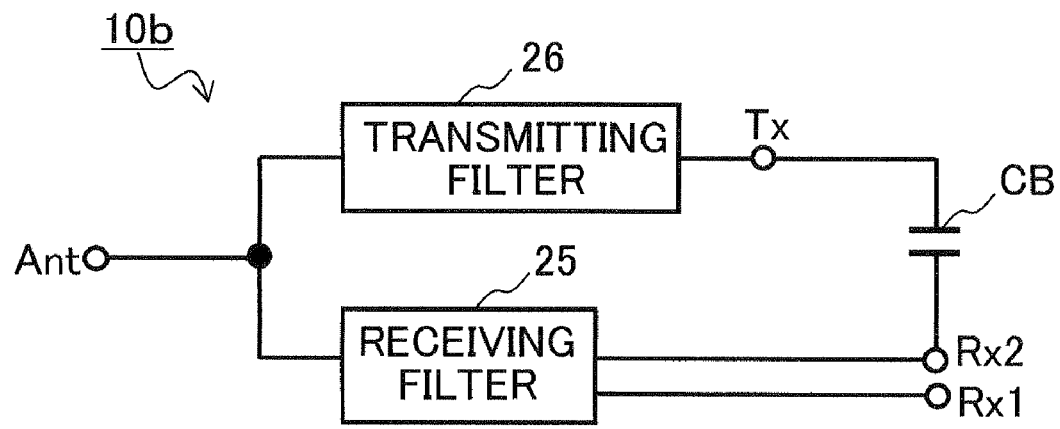
FIG. 34 is a circuit diagram illustrating another example of the bridging capacitor CB.
Figure 35:
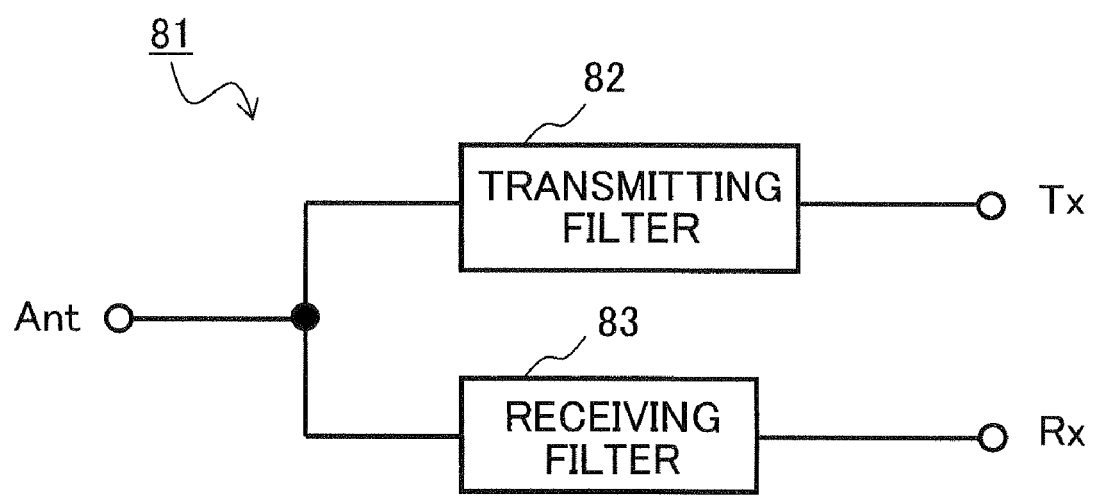
FIG. 35 is a view illustrating a branching filter.

It is sufficient that the bridging capacitor is one used to couple a line in the antenna terminal Ant side or the transmitting terminal Tx side relative to the receiving filter 25 to a line in the receiving terminal Rx1 or Tx2 side relative to the receiving filter 25. For example, as in the antenna branching filter 10b illustrated in FIG. 34, the receiving terminal Rx2 and the transmitting terminal Tx may be coupled via the bridging capacitor CB.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. A filter comprising:
   a converter circuit, provided with a single-type common terminal and two balanced terminals, for performing conversion between a balanced line and an unbalanced line;
   two filter units coupled to the balanced terminals of the converter circuit and allowing passage of a signal in a pass band; and
   a bridging capacitor arranged to extend across the converter circuit and one of the filter units in a bridging manner,
   wherein a first inductance of an opposite-side line of one of the filter units relative to the converter circuit is electromagnetically coupled to a second inductance of a line coupling the other filter unit and the converter circuit.

2. The filter according to claim 1,
   wherein the phase shift angle of the converter circuit is set so that a signal outputted via the bridging capacitor has a phase opposite to that of a signal outputted via the converter circuit and one of the filter units in a band other than the pass band of the filter unit.

3. The filter according to claim 1,
   wherein the filter is formed on a package or a substrate, and
   wherein the electromagnetic coupling of the first inductance and the second inductance is implemented by a transmission line on the package or the substrate.

4. The filter according to claim 1,
   wherein the filter is formed on a substrate including a plurality of layers,
   wherein the second inductance is formed by a line formed in at least one of the layers in the substrate, and
   wherein a ground pattern is formed in a layer neighboring the layer where the second inductance is formed, and the ground pattern is removed in a section which overlaps the line forming the second inductance in a stacking direction.

5. The filter according to claim 4,
   wherein the ground pattern is disposed over most of the area of the layer where the ground pattern is arranged.

6. The filter according to claim 5,
   wherein the width of the ground pattern removed is the same as or greater than the width of the line forming the second inductance, and is the same as or smaller than twice the width of the line forming the second inductance.

7. A branching filter comprising:
   a converter circuit, provided with a single-type common terminal and two balanced terminals, for performing conversion between a balanced line and an unbalanced line;
   two receiving filter units coupled respectively to the balanced terminals and two output terminals of the converter circuit and allowing passage of a signal in a pass band;
   a bridging capacitor arranged to extend across the converter circuit and one of the receiving filter units in a bridging manner; and
   a transmitting filter coupled between the common terminal and a transmitting terminal,
   wherein a first inductance at an output terminal of one of the receiving filter units is electromagnetically coupled to a second inductance at a balanced terminal of the other receiving filter unit.

8. The branching filter according to claim 7,
   wherein the phase shift angle of the converter circuit is set so that a signal outputted via the bridging capacitor has a phase opposite to that of a signal outputted via the converter circuit and one of the filter units in a band other than the pass band of the receiving filter unit.

9. The branching filter according to claim 7,
wherein the receiving filter is formed on a package or a substrate, and
wherein the electromagnetic coupling of the first inductance and the second inductance is implemented by a transmission line on the package or the substrate.

10. The branching filter according to claim 7,
wherein the receiving filter unit is formed on a substrate including a plurality of layers,
wherein the second inductance is formed by a line formed in at least one of the layers in the substrate, and
wherein a ground pattern is formed in a layer neighboring the layer where the second inductance is formed, and the ground pattern is removed in a section which overlaps the line forming the second inductance in a stacking direction.

11. The branching filter according to claim 10,
wherein the ground pattern is disposed over most of the area of the layer where the ground pattern is arranged.

12. The branching filter according to claim 11,
wherein the width of the ground pattern removed is the same or greater than the width of the line forming the second inductance, and is the same or smaller than twice the width of the line.

13. A communication apparatus comprising a filter including:
a converter circuit, provided with a single-type common terminal and two balanced terminals, for performing conversion between a balanced line and an unbalanced line;
two filter units coupled respectively to the balanced terminals of the converter circuit and allowing passage of a signal in a pass band; and
a bridging capacitor arranged to extend across the converter circuit and one of the filter units in a bridging manner,
wherein a first inductance of an opposite-side line of one of the filter units relative to the converter circuit is electromagnetically coupled to a second inductance of a line coupling the other filter unit and the converter circuit.

14. The communication apparatus according to claim 13,
wherein the phase shift angle of the converter circuit is set so that a signal outputted via the bridging capacitor has a phase opposite to that of a signal outputted via the converter circuit and one of the filter units in a band other than the pass band of the receiving filter unit.

15. The communication apparatus according to claim 13,
wherein the filter is formed on a package or a substrate, and
wherein the electromagnetic coupling of the first inductance and the second inductance is implemented by a transmission line on the package or the substrate.

16. The communication apparatus according to claim 13,
wherein the filter is formed on a substrate including a plurality of layers,
wherein the second inductance is formed by a line formed in at least one of the layers in the substrate, and
wherein a ground pattern is formed in a layer neighboring the layer where the second inductance is formed, and the ground pattern is removed in a section which overlaps the line forming the second inductance in a stacking direction.

17. The communication apparatus according to claim 16,
wherein the ground pattern is disposed over most of the area of the layer where the ground pattern is arranged.

18. The communication apparatus according to claim 17,
wherein the width of the ground pattern removed is the same or greater than the width of the line forming the second inductance, and is the same or smaller than twice the width of the line.

* * * * *